United States Patent [19]
Foulke et al.

[11] Patent Number: 6,056,190
[45] Date of Patent: May 2, 2000

[54] SOLDER BALL PLACEMENT APPARATUS

[75] Inventors: Richard F. Foulke, Stoneham; Richard F. Foulke, Jr., Westford; Cord W. Ohlenbusch, Andover, all of Mass.

[73] Assignee: Speedline Technologies, Inc., Franklin, Mass.

[21] Appl. No.: 09/116,012

[22] Filed: Jul. 15, 1998

Related U.S. Application Data

[63] Continuation-in-part of application No. 08/795,543, Feb. 6, 1997.

[51] Int. Cl.⁷ .................................................. B23K 35/12
[52] U.S. Cl. ........................... 228/246; 228/41; 228/56.3; 228/8; 228/105; 228/245; 228/180; 228/253
[58] Field of Search ........................... 228/246, 41, 56.3, 228/8, 105, 245, 180, 253

[56] References Cited

U.S. PATENT DOCUMENTS

| | | | |
|---|---|---|---|
| 3,472,365 | 10/1969 | Tiedema et al. | 206/56 |
| 3,589,000 | 6/1971 | Galli | 29/590 |
| 4,209,893 | 7/1980 | Dyce et al. | 29/522 R |
| 4,216,350 | 8/1980 | Reid | 174/68.5 |
| 4,437,232 | 3/1984 | Araki et al. | 29/740 |
| 4,684,055 | 8/1987 | Baer et al. | 228/180.1 |
| 4,712,721 | 12/1987 | Noel et al. | 228/56.3 |
| 4,722,470 | 2/1988 | Johary | 228/180.2 |
| 4,733,823 | 3/1988 | Waggener et al. | 239/601 |
| 4,842,184 | 6/1989 | Miller, Jr. | 228/180.1 |
| 4,871,110 | 10/1989 | Fukasawa et al. | 228/245 |
| 4,872,232 | 10/1989 | Sanyal et al. | 29/840 |
| 4,898,320 | 2/1990 | Dunaway et al. | 228/245 |
| 4,903,889 | 2/1990 | Svendsen et al. | 228/180.2 |
| 4,906,823 | 3/1990 | Kushima et al. | 228/245 |
| 5,029,748 | 7/1991 | Lauterbach et al. | 228/180.1 |
| 5,048,747 | 9/1991 | Clark et al. | 228/180.2 |
| 5,108,024 | 4/1992 | Kazem-Goudarzi et al. | 228/104 |
| 5,118,027 | 6/1992 | Braun et al. | 228/180.2 |
| 5,118,584 | 6/1992 | Evans et al. | 430/313 |
| 5,148,375 | 9/1992 | Horikami | 364/552 |
| 5,172,853 | 12/1992 | Maiwald | 228/248 |
| 5,205,896 | 4/1993 | Brown et al. | 156/297 |
| 5,211,328 | 5/1993 | Ameen et al. | 228/180.2 |
| 5,219,117 | 6/1993 | Lin | 228/253 |

(List continued on next page.)

FOREIGN PATENT DOCUMENTS

| | | |
|---|---|---|
| 9186165 | of 0000 | Japan . |
| 6310515 | 11/1994 | Japan . |
| 7106739 | 4/1995 | Japan . |
| 8008523 | 1/1996 | Japan . |
| 8264930 | 1/1996 | Japan . |
| 8112671 | 5/1996 | Japan . |
| 8153957 | 6/1996 | Japan . |
| 8153959 | 6/1996 | Japan . |
| 8162493 | 6/1996 | Japan . |
| 8162494 | 6/1996 | Japan . |
| 8236916 | 9/1996 | Japan . |
| 8242070 | 9/1996 | Japan . |
| 9191027 | 7/1997 | Japan . |
| 9223712 | 8/1997 | Japan . |
| 9246422 | 9/1997 | Japan . |
| WO96/09744 | 3/1996 | WIPO . |

*Primary Examiner*—Patrick Ryan
*Assistant Examiner*—M. Alexandra Ene
*Attorney, Agent, or Firm*—Mintz, Levin, Cohn, Ferris, Glovsky and Popeo, P.C.

[57] ABSTRACT

An apparatus for placing an array of solder balls on a substrate includes a carrier plate having an array of holes therethrough. Each hole is capable of holding a solder ball. A ball placement head having an array of pins is aligned with a desired pattern of solder balls held by the carrier plate. The array of pins push the pattern of solder balls through the holes in the carrier plate onto the substrate. The invention is also directed to a solder ball dispenser for dispensing solder balls to a plate having an upper surface with an array of holes formed therein. The solder ball dispenser includes a plate support to support the plate such that the upper surface is tilted at an angle from horizontal, a ball feed device to provide solder balls to the plate, and a solder ball retainer. The solder ball retainer is movable across the upper surface of the plate for controlling a speed at which the solder balls move across the plate.

20 Claims, 34 Drawing Sheets

U.S. PATENT DOCUMENTS

| | | | |
|---|---|---|---|
| 5,220,200 | 6/1993 | Blanton | 257/778 |
| 5,254,362 | 10/1993 | Shaffer et al. | 427/96 |
| 5,261,593 | 11/1993 | Casson et al. | 228/180.22 |
| 5,275,970 | 1/1994 | Itoh et al. | 437/183 |
| 5,284,287 | 2/1994 | Wilson et al. | 228/180.2 |
| 5,289,631 | 3/1994 | Koopman et al. | 29/840 |
| 5,323,947 | 6/1994 | Juskey et al. | 228/56.3 |
| 5,356,658 | 10/1994 | Hertz et al. | 427/96 |
| 5,356,838 | 10/1994 | Kim | 437/226 |
| 5,363,277 | 11/1994 | Tanaka | 361/760 |
| 5,373,984 | 12/1994 | Wentworth | 228/180.1 |
| 5,388,327 | 2/1995 | Trabucco | 29/830 |
| 5,431,332 | 7/1995 | Kirby et al. | 228/246 |
| 5,438,223 | 8/1995 | Higashi et al. | 257/774 |
| 5,442,852 | 8/1995 | Danner | 29/843 |
| 5,445,313 | 8/1995 | Boyd et al. | 228/248.1 |
| 5,467,913 | 11/1995 | Namekawa et al. | 228/41 |
| 5,492,266 | 2/1996 | Hoebener et al. | 228/248.1 |
| 5,497,938 | 3/1996 | McMahon et al. | 228/253 |
| 5,499,487 | 3/1996 | McGill | 53/473 |
| 5,504,277 | 4/1996 | Danner | 174/261 |
| 5,511,306 | 4/1996 | Denton et al. | 29/840 |
| 5,519,580 | 5/1996 | Natarajan et al. | 361/760 |
| 5,540,377 | 7/1996 | Ito | 228/41 |
| 5,547,530 | 8/1996 | Nakamura et al. | 156/89 |
| 5,551,216 | 9/1996 | McGill | 53/473 |
| 5,574,801 | 11/1996 | Collet-Beillon | 382/150 |
| 5,601,229 | 2/1997 | Nakazato et al. | 288/246 |
| 5,607,099 | 3/1997 | Yeh et al. | 228/180.22 |
| 5,620,129 | 4/1997 | Rogren | 228/56.3 |
| 5,620,927 | 4/1997 | Lee | 29/841 |
| 5,626,277 | 5/1997 | Kawada | 228/41 |
| 5,637,832 | 6/1997 | Danner | 174/260 |
| 5,643,831 | 7/1997 | Ochiai et al. | 228/180.22 |
| 5,655,704 | 8/1997 | Sakemi et al. | 228/246 |
| 5,657,528 | 8/1997 | Sakemi et al. | 29/430 |
| 5,658,827 | 8/1997 | Aulicino et al. | 228/180.22 |
| 5,662,262 | 9/1997 | McMahon et al. | 228/56.3 |
| 5,680,984 | 10/1997 | Sakemi | 228/246 |
| 5,685,477 | 11/1997 | Mallik et al. | 228/254 |
| 5,704,536 | 1/1998 | Chen et al. | 228/41 |
| 5,765,744 | 6/1998 | Tatumi et al. | 228/254 |

SOLDER BALL PLACEMENT APPARATUS

RELATED APPLICATION

This application is a continuation in part of U.S. application Ser. No. 08/795,543, filed Feb. 6, 1997 which is incorporated by reference herein.

BACKGROUND OF THE INVENTION

In the manufacture of semiconductor devices, it is common to place small solder balls upon the substrate of the semiconductor device in a ball grid array and then reflow the solder balls in an oven to provide a series of electrical connections on the substrate. Currently, there are several different approaches for placing solder balls to form ball grid arrays onto semiconductors and other electrical devices.

In one approach, an array of solder balls is picked up with a vacuum head. Each solder ball is held by a separate vacuum nozzle in the vacuum head. The vacuum head then places the solder balls on the semiconductor substrate and releases the solder balls thereon.

In another approach, a mask is placed over the semiconductor substrate. The mask has an array of openings formed therethrough corresponding to the desired pattern of electrical connections on the substrate. A quantity of solder balls is then spread across the mask with an air knife or a squeegee. Some of the solder balls fall into and are captured by the openings in the mask thereby positioning the solder balls in the desired pattern on the substrate.

In still another approach, a transfer substrate is formed with an array of indentations corresponding to the desired pattern of electrical connections on the substrate. The array of indentations is then filled with solder balls. The semiconductor substrate is brought face down into contact with the array of solder balls lying on the transfer substrate. The solder balls are then reflowed and metallurgically bonded to the semiconductor substrate.

SUMMARY OF THE INVENTION

In some applications, as many as 2000 solder balls about 0.012 inches to 0.030 inches in diameter are placed on a semiconductor substrate in an area of about four square inches. As a result, the large number of small sized solder balls makes it sometimes difficult to consistently place a full array of solder balls on a semiconductor substrate with current machinery.

The present invention provides an apparatus for placing an array of solder balls on a semiconductor substrate which is more reliable in the placement of the solder balls than previous approaches. The present invention apparatus includes a carrier plate having a series of holes therethrough. Each hole is capable of holding a solder ball. At least a portion of a first pattern of protrusions on a ball placement head is aligned with a first pattern of solder balls held by the carrier plate. The protrusions push the first pattern of solder balls through the holes in the carrier plate onto the substrate.

In preferred embodiments, a solder ball feed fills the carrier plate with solder balls. The feed includes a compliant wiping element for wiping excess solder balls from the carrier plate. A second pattern of protrusions on a pattern head is aligned with some of the solder balls held by the carrier plate for pushing a second pattern of solder balls from the carrier plate so that only the first pattern of solder balls remains held by the carrier plate. Each protrusion on the ball placement and pattern heads is a pin which is self-aligning with a corresponding hole in the carrier plate.

A first sensing system senses whether all the required holes in the carrier plate contain a solder ball after being filled by the solder ball feed. The first sensing system includes a vision device and a light positioned behind the carrier plate for back lighting the carrier plate. A second sensing system senses whether the carrier plate contains solder balls only in the first pattern after the pattern head pushes the second pattern of solder balls from the carrier plate. The second sensing system includes a vision device, a light positioned behind the carrier plate for back lighting the carrier plate for detecting whether the carrier plate holds solder balls only in the first pattern, and a light positioned in front of the carrier plate for front lighting the carrier plate for detecting any stray solder balls on top of the carrier plate.

The carrier plate in one preferred embodiment includes a film sandwiched between a first plate portion and a second plate portion. The series of holes in the carrier plate pass through the first plate portion, the film and the second plate portion. The holes in the first and second plate portions are dimensioned to allow passage of the solder balls therethrough while the holes through the film are dimensioned to prevent passage of the solder balls through the film by gravity while allowing passage through the film when pushed by the ball placement head.

In another preferred embodiment, the holes in the carrier plate are dimensioned to prevent passage of the balls therethrough, but to allow pins from a ball placement head disposed beneath the carrier plate to push the solder balls back through the openings in the top of the carrier plate. In this embodiment, the semiconductor substrate that is to receive the solder balls is disposed upside down above the carrier plate so that the solder balls can be pushed out of the holes and against the top surface of the semiconductor substrate.

The first sensing system, pattern head, second sensing system and ball placement head are arranged in a circular path at a first sensing station, a pattern head station, a second sensing station and a ball placement station, respectively. A rotatable carousel having a support finger for supporting the carrier plate transfers the carrier plate to each station. The carousel provides for simultaneous operation at each station resulting in higher through put.

Another embodiment of the present invention is directed to a solder ball dispenser for dispensing solder balls to a plate having an upper surface with an array of holes formed therein. The solder ball dispenser includes a plate support constructed and arranged to support the plate such that the upper surface is tilted at an angle from horizontal, a ball feed device disposed above the plate support to provide solder balls to the plate, and a solder ball retainer positioned above the plate support. The solder ball retainer is movable across the upper surface of the plate to control a speed at which the solder balls move across the plate.

The solder ball dispenser can include a ball sweeper to sweep stray solder balls from the plate. The solder ball retainer can be a bottomless enclosure that contains the solder balls as the solder balls move across the plate. The solder ball retainer can have a sloped leading wall, and a rear portion at which the ball sweeper is located. The solder ball dispenser can further include a spreading device that spreads the solder balls over the plate, and the spreading device can include an angled surface that disperses the balls. The plate support can be constructed and arranged such that the angle from horizontal is between 18° and 25°. The solder ball dispenser can include a recirculating tray that catches unused solder balls and dumps the unused solder balls back into the ball feed. The solder ball feed can include a cassette style removable reservoir.

BRIEF DESCRIPTION OF THE DRAWINGS

The foregoing and other objects, features and advantages of the invention will be apparent from the following more particular description of preferred embodiments of the drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
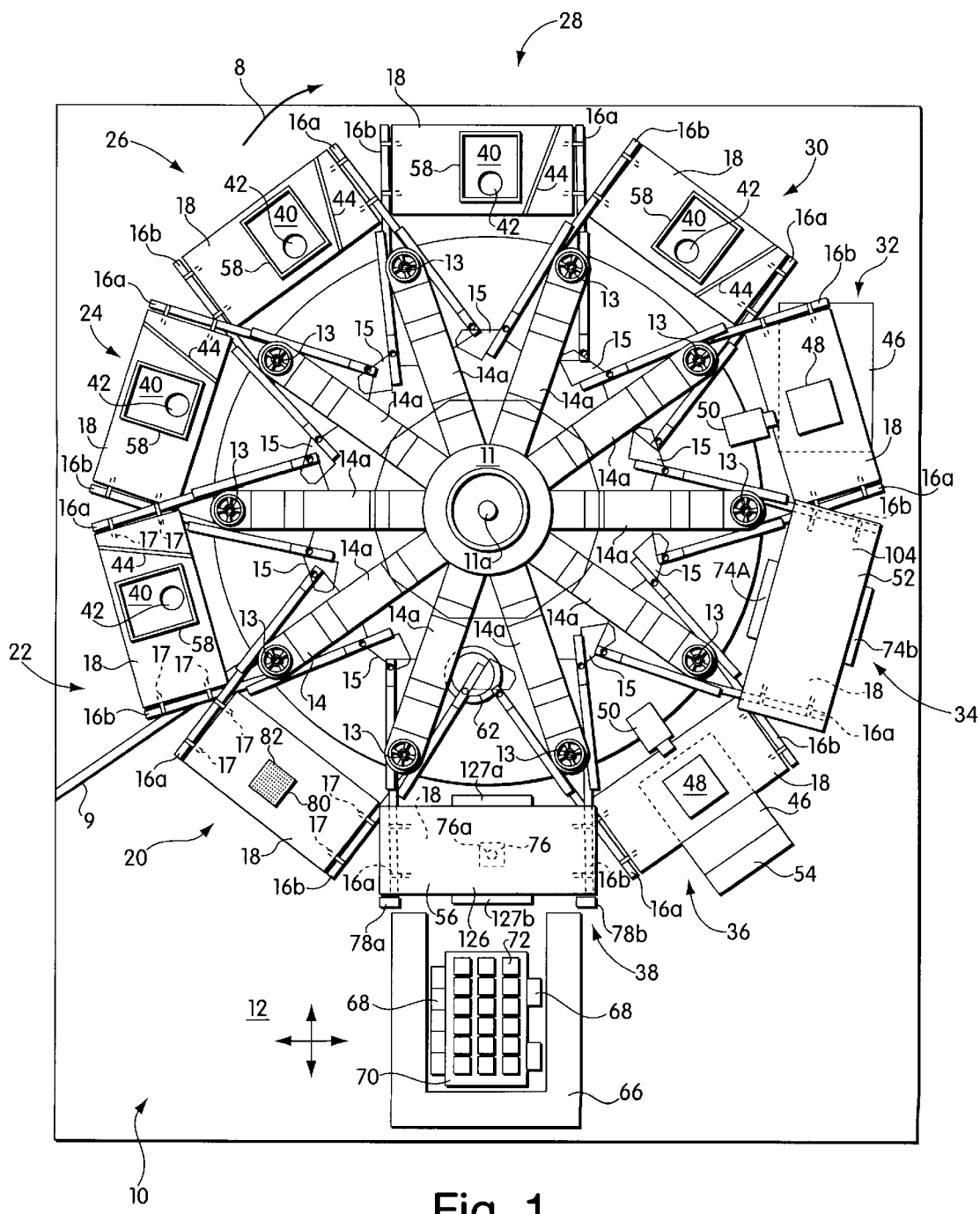
FIG. 1 is a plan view of the present invention solder ball placement apparatus.

In a first embodiment of the present invention, shown in FIG. 1, a solder ball placement apparatus 10 includes an indexing carousel 14 which is positioned above a table top 12. Carousel 14 includes ten arms 14a extending outwardly from a central hub 11 which rotates about a rotation point 11a. The arms 14a support ten pairs of spring loaded support fingers 16a and 16b for supporting ten carrier plates 18 with pins 17. Each carrier plate 18 includes an array 80 of holes 82 formed therethrough which support solder balls 102 (FIG. 5) for placement onto a semiconductor substrate part 72. Carousel 14 transfers the ten carrier plates 18 between ten different workstations arranged in a circle by incrementally rotating in the direction of arrow 8 (clockwise).

Apparatus 10 includes a load/unload station 20 at which the carrier plates 18 are loaded or unloaded. Five ball feed stations 22, 24, 26, 28 and 30 are positioned after load/unload station 20 for progressively filling the array 80 of holes 82 in carrier plate 18 with solder balls 102. A first sensing station 32 is positioned after ball feed station 30 for determining whether all the required holes 82 in the array 80 of carrier plate 18 are filled with solder balls 102. A pattern head station 34 is positioned after the first sensing station 32 for creating a desired pattern 81 (FIG. 6) of solder balls 102 by removing a pattern 83 of unneeded solder balls 102 from the array 80 of holes 82. A second sensing station 36 is positioned after the pattern head station 34 for determining whether the desired solder ball 102 pattern 81 has been attained. A ball placement station 38 is positioned after the second sensing station 34 for placing the pattern 81 of solder balls 102 from carrier plate 18 onto a part 72. An X-Y table 66 is positioned adjacent to ball placement station 38 for translating an array of parts 72 held in a JEDEC compatible tray 70 into ball placement station 38.

Figure 2:
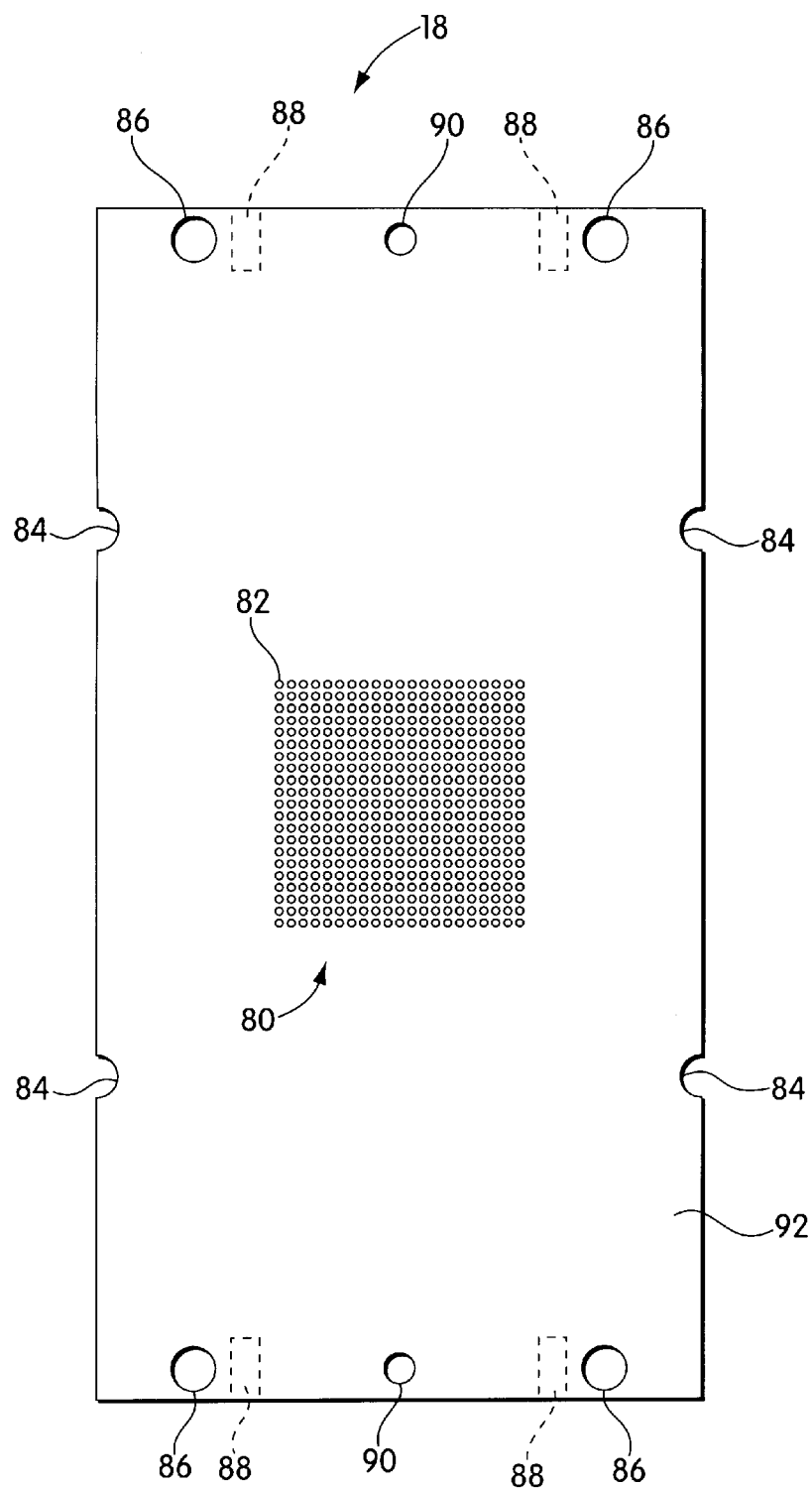
FIG. 2 is a plan view of the carrier plate employed in the present invention apparatus.

In operation, apparatus 10 first must be loaded with at least one and up to ten carrier plates 18 (FIG. 2). This is accomplished by placing a carrier plate 18 at load/unload station 20 between the support fingers 16a/16b and on top of pins 17. The carousel 14 is indexed one increment and the procedure is preferably repeated nine more times.

The following discussion describes the sequence of operations for filling and dispensing solder balls 102 from one carrier plate 18 as the carrier plate 18 is indexed by carousel 14. Carrier plate 18 is supported by support fingers 16a/16b at load/unload station 20 and indexed to ball feed station 22 by carousel 14. Ball feed 40 drops a quantity of Solder balls 102 onto carrier plate 18 for filling the array 80 of holes 82 with solder balls 102. Ball feed station 22 fills the majority of the holes 82 in array 80. Carrier plate 18 is then indexed to ball feed station 24. As carrier plate 18 is indexed, a wiping element 44 wipes solder balls 102 on top of carrier plate 18 which did not fall into a hole 82 from the carrier plate 18. Ball feed stations 24, 26, 28 and 30 repeat the ball feed procedure performed by ball feed station 22 to progressively fill the remaining unfilled holes 82 in array 80 if required. Carousel 14 indexes carrier plate 18 to each station.

Figure 5:
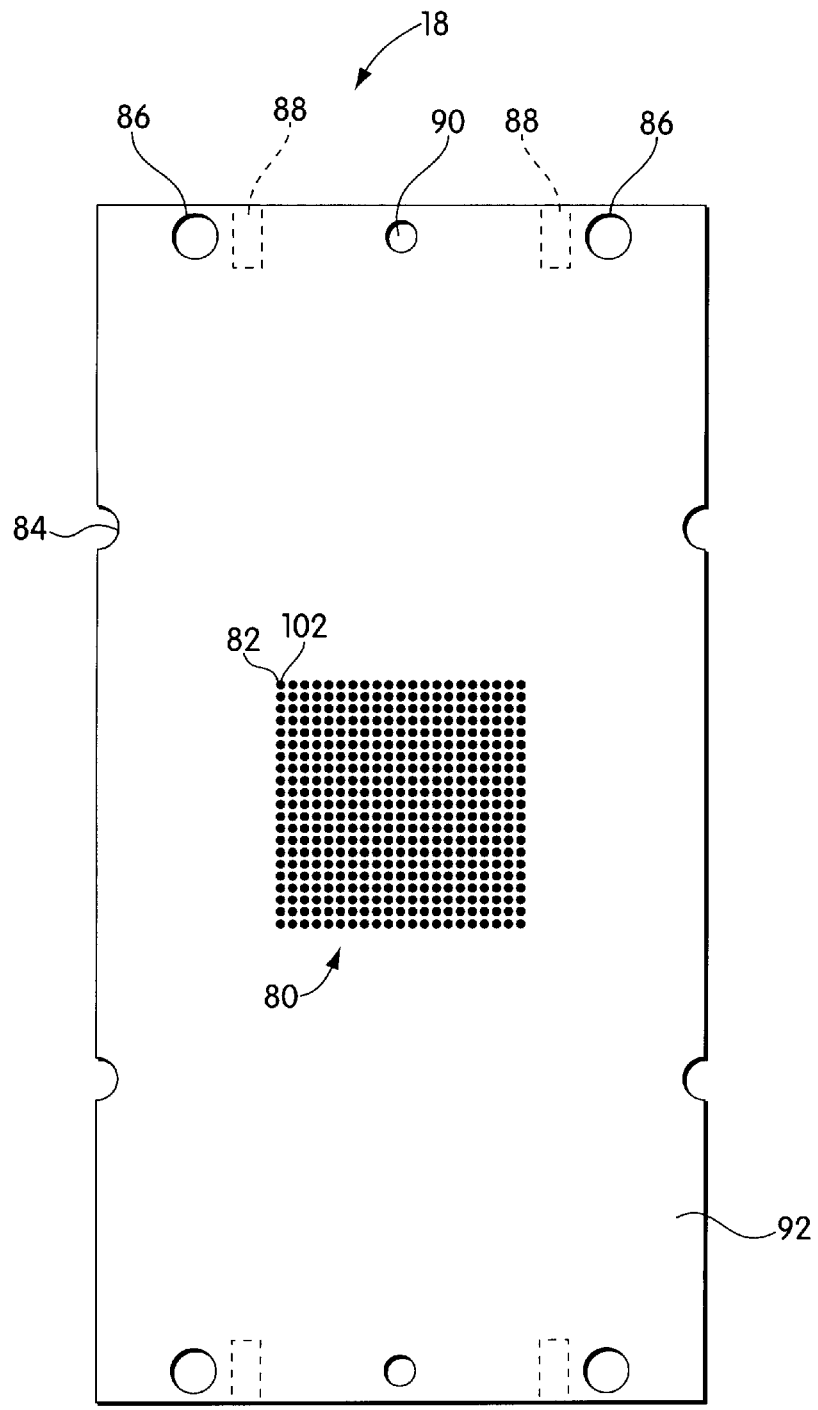
FIG. 5 is a plan view of the carrier plate containing a full array of solder balls.

Carrier plate 18 is indexed from ball feed station 30 to the first sensing station 32 preferably completely filled with solder balls 102 (FIG. 5). Carrier plate 18 is illuminated from below the carrier plate 18 by a light source 46. Camera 50 views the array 80 on carrier plate 18 via mirror 48. If the array 80 of holes 82 is not completely filled as required with solder balls 102, carrier plate 18 is indexed forward to by pass the remaining operations and returns to the ball feed station 22. If the array 80 is completely filled with solder balls 102 as required, carrier plate 18 is indexed to pattern head station 34. Array 80 can have holes 82 which are not filled with solder balls 102 but which also are not part of the desired pattern 81 (discussed below).

Figure 6:
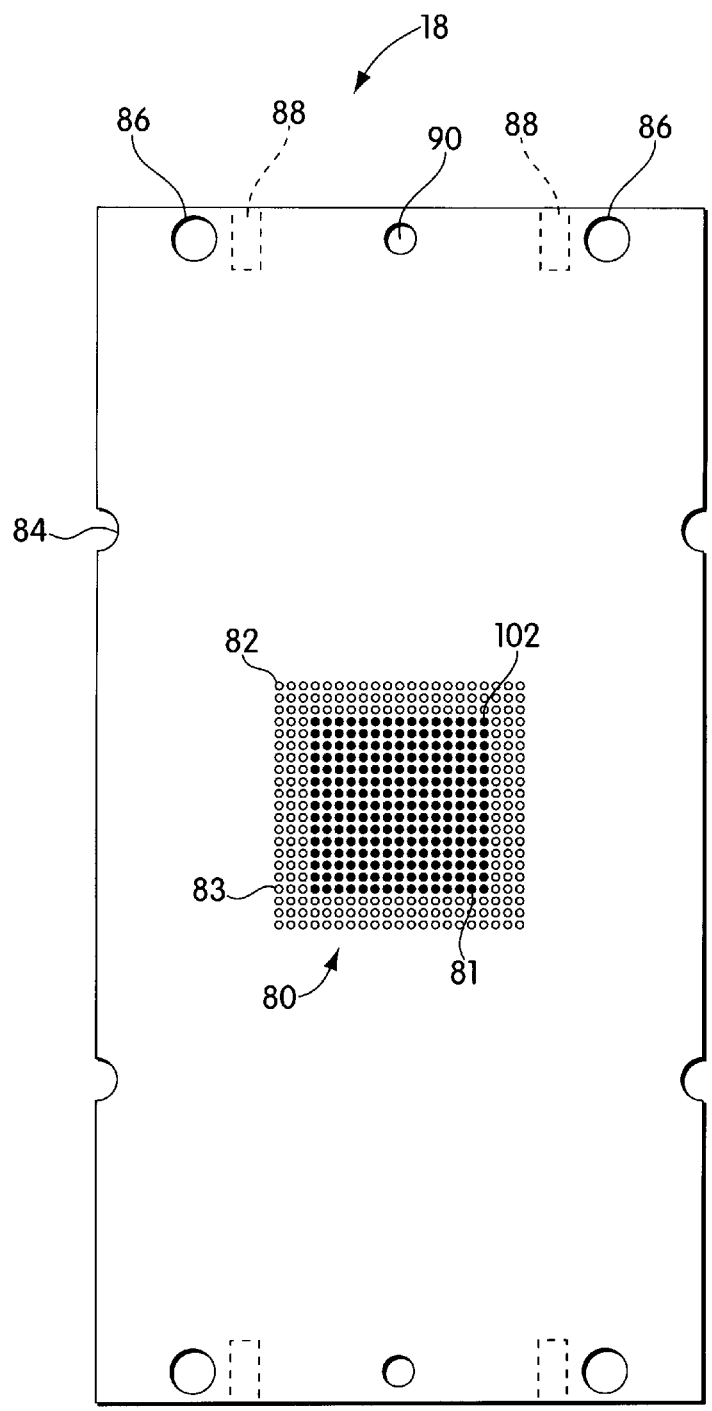
FIG. 6 is a plan view of the carrier plate containing a partial array of a desired pattern of solder balls after removal of unneeded solder balls by the pattern head.

Pattern head station 34 includes a pattern head assembly 52 having a pattern head 104 and pattern head grippers 74a/74b. At pattern head station 34, the pattern head grippers 74a/74b grip the carrier plate 18. Pattern head grippers 74a/74b then lift carrier plate 18 off pins 17 of support fingers 16a/16b bringing the carrier plate 18 upwardly against pattern head 104. Pattern head 104 pushes a predetermined pattern 83 of unneeded solder balls 102 from the array 80 of carrier plate 18 with a series of pins 108 (FIGS. 10 and 11) leaving behind a desired pattern 81 as seen in FIG. 6. Carrier plate 18 is lowered back onto pins 17 of support fingers 16a/16b.

Pattern head grippers 74a/74b then release carrier plate 18 and carousel 14 indexes carrier plate 18 to the second sensing station 36. Carrier plate 18 is illuminated from below by a light source 46 and from above by a light source 54. As in the first sensing station 32, the array 80 on carrier plate 18 is viewed by a camera 50 via mirror 48. Light source 46 enables camera 50 to see whether the solder balls 102 in the array 80 are in the desired pattern 81. Light source 54 enables camera 50 to see whether any stray solder balls 102 are on top of carrier plate 18 which can then be removed, for example, by an air jet or a wiper. If the pattern 81 of solder balls 102 in array 80 is correct, carrier plate 18 is indexed to ball placement station 38. Photo sensors 78a and 78b insure that carrier plate 18 is properly indexed to ball placement station 38.

Figure 18:
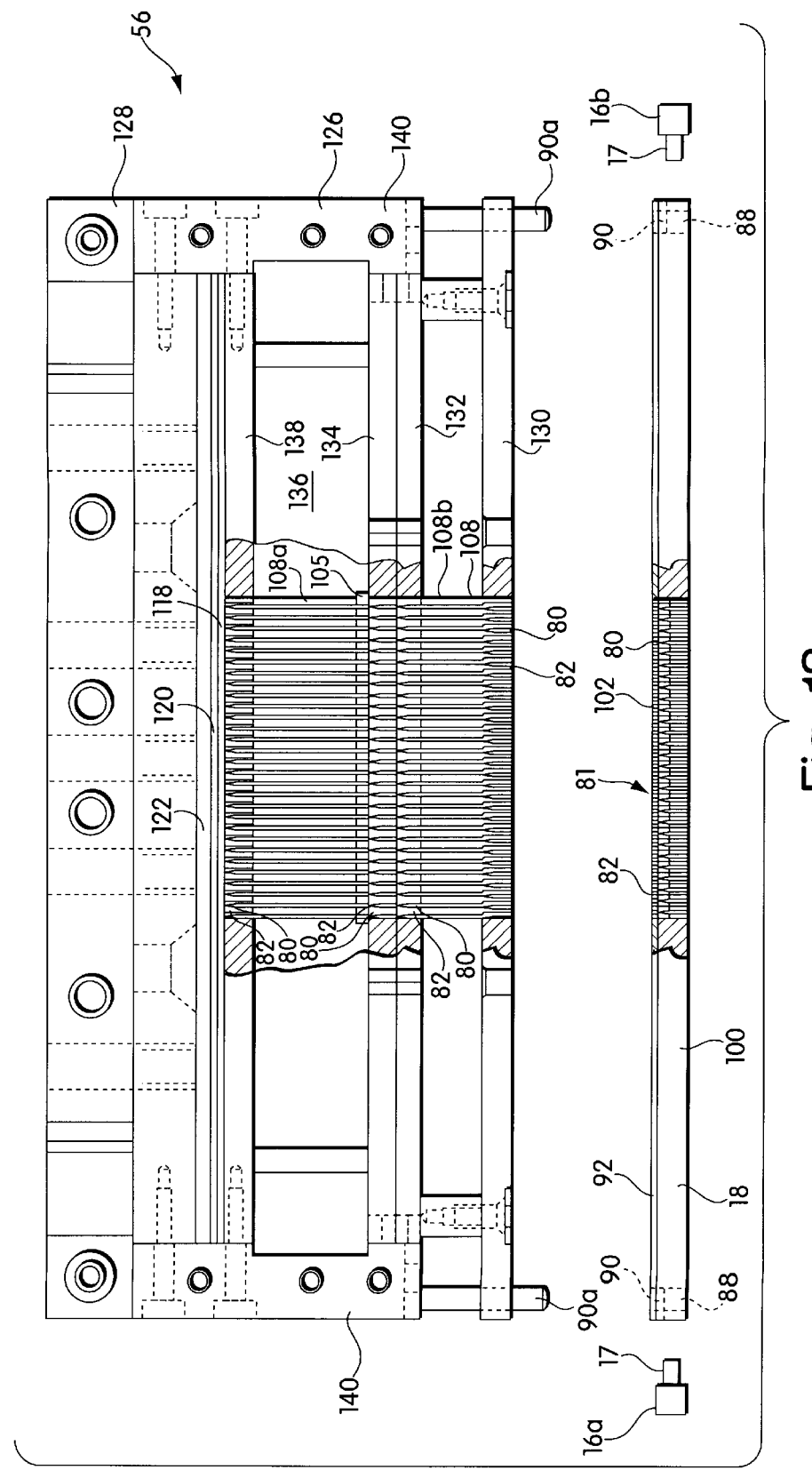
FIG. 18 is a partial side sectional view of the ball placement head positioned above the carrier plate.

Ball placement station 38 includes a ball placement head assembly 56 having a ball placement head 126 and ball placement grippers 127a/127b. At ball placement station 38, carrier plate 18 is gripped by ball placement grippers 127a/127b. X-Y table 66 holding a tray 70 of parts 72 with grippers 68 aligns a part 72 underneath array 80 of carrier plate 18. A vacuum chuck 76 located below part 72 moves upwardly and secures part 72 thereon with a vacuum nozzle 76a. Vacuum chuck 76 lifts part 72 slightly above its resting location on tray 70. Finger actuator 62 causes support fingers 16a/16b to open. Ball placement grippers 127a/127b move carrier plate downwardly to a position just above part 72 (about 0.020 inches above part 72). Ball placement head 126 then moves downwardly relative to carrier plate 18 and pushes the desired pattern 81 (FIG. 6) of solder balls 102 from carrier plate 18 onto part 72 with an array of pins 108 (FIG. 18). The solder balls 102 are positioned onto blobs of flux 72a (FIG. 20) deposited onto part 72 by either a pin transfer process or a screening process. Ball placement head 126 then moves upwardly. Ball placement grippers 127a/127b also move the carrier plate 18 upwardly and the support fingers 16a/16b are closed by finger actuator 62 to support the carrier plate 18. Vacuum chuck 76 moves downwardly to return part 72 to tray 70. Ball placement grippers 127a/127b release carrier plate 18 and carrier plate 18 is then indexed to load/unload station 20 and the cycle is repeated.

The procedures performed by each station 22, 24, 26, 28, 30, 32, 34, 36 and 38 occur simultaneously as carousel 14 incrementally rotates. The X-Y table 66 moves each part 72 in tray 70 under ball placement head 126 until the desired pattern 81 of solder balls 102 is positioned on all the parts. Once this is accomplished, a new tray 70 of parts 72 is loaded into X-Y table 66.

If one of the carrier plates 18 is rejected more than once at either the first sensing station 32 or the second sensing station 36, apparatus 10 can be programmed to notify the machine operator. In such a case, the carrier plate 18 may be deemed defective and replaced with a new carrier plate 18 at load/unload station 20.

A more detailed description of the components of apparatus 10 now follows. Each arm 14a on carousel 14 supports two fingers 16a and 16b which are pivotally mounted to the carousel arm 14a in a scissor arrangement. This scissor arrangement is spring-loaded by a spring assembly 13. The finger 16a on one carousel arm 14a is connected to an opposing finger 16b mounted on an adjacent carousel arm 14a by a cam 15 such that the opposing fingers 16a/16b can be opened and closed by finger actuator 62. Each opposing finger 16a/16b includes two horizontal pins 17 which face each other for engaging recesses 88 in carrier plate 18 (FIGS. 2 and 3) in order to support carrier plate 18 in the proper location. Carousel 14 is indexed by a servo motor coupled to a gear reducer. A ball barrier 9 is positioned under carousel 14 separating ball feed stations 22, 23, 26, 28 and 30 from stations 32, 34, 36, 38 and 20. This helps keep loose solder balls 102 from contaminating stations 32, 34, 36, 38 and 20.

Figure 3:
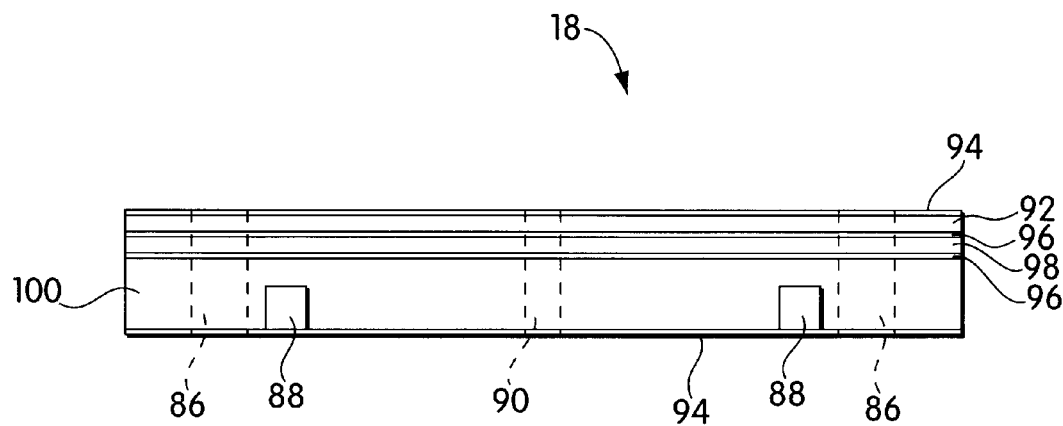
FIG. 3 is a an end view of the carrier plate.
Figure 4:
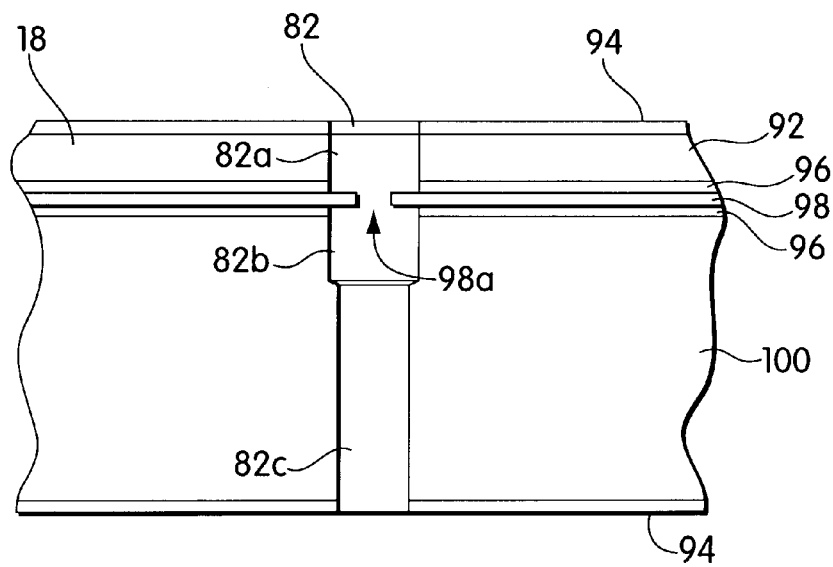
FIG. 4 is a side sectional view of a portion of the carrier plate showing a single hole through the carrier plate.

Referring to FIGS. 2, 3 and 4, carrier plate 18 is formed by laminating a film 98 of resilient plastic, such as Kapton™ between two plates 92 and 100 made of printed circuit board material. Preferably, top plate 92 is about 0.020 inches thick, film 98 is about 0.0005 inches thick and lower plate 100 is about 0.125 inches thick. Top Plate 92, film 98 and lower plate 100 are laminated together with two adhesive layers 96 which are about 0.0005 inches thick. The outer surfaces of plates 92 and 100 are gold plated so that carrier plate 18 can be grounded to prevent static electricity as well as to prevent damage to parts 72. The gold plating also provides easily cleaned surfaces. Carrier plate 18 is preferably about 5 inches long and 2.5 inches wide.

Each hole 82 in array 80 includes a first portion 82a (FIG. 4) within top plate 92 which is about 0.036 inches in diameter for holding a solder ball about 0.030 inches in diameter. Each hole 82 also includes a funnel portion within lower plate 100 having a wider inlet 82b and a narrower outlet 82c which is about 0.032 inches in diameter for precise solder ball placement. Holes 82 are preferably about 0.050 inches apart from each other. The film 98 has an opening 98a formed by slitting the film 98 with two slits crossing at right angles to each other. The film 98 is stiff enough to prevent a solder ball 102 from passing through opening 98a under its own weight but is flexible enough to allow the solder ball 102 to be pushed through by the pins 108 (FIG. 11) of pattern head 104 and ball placement head 126.

Figure 13:
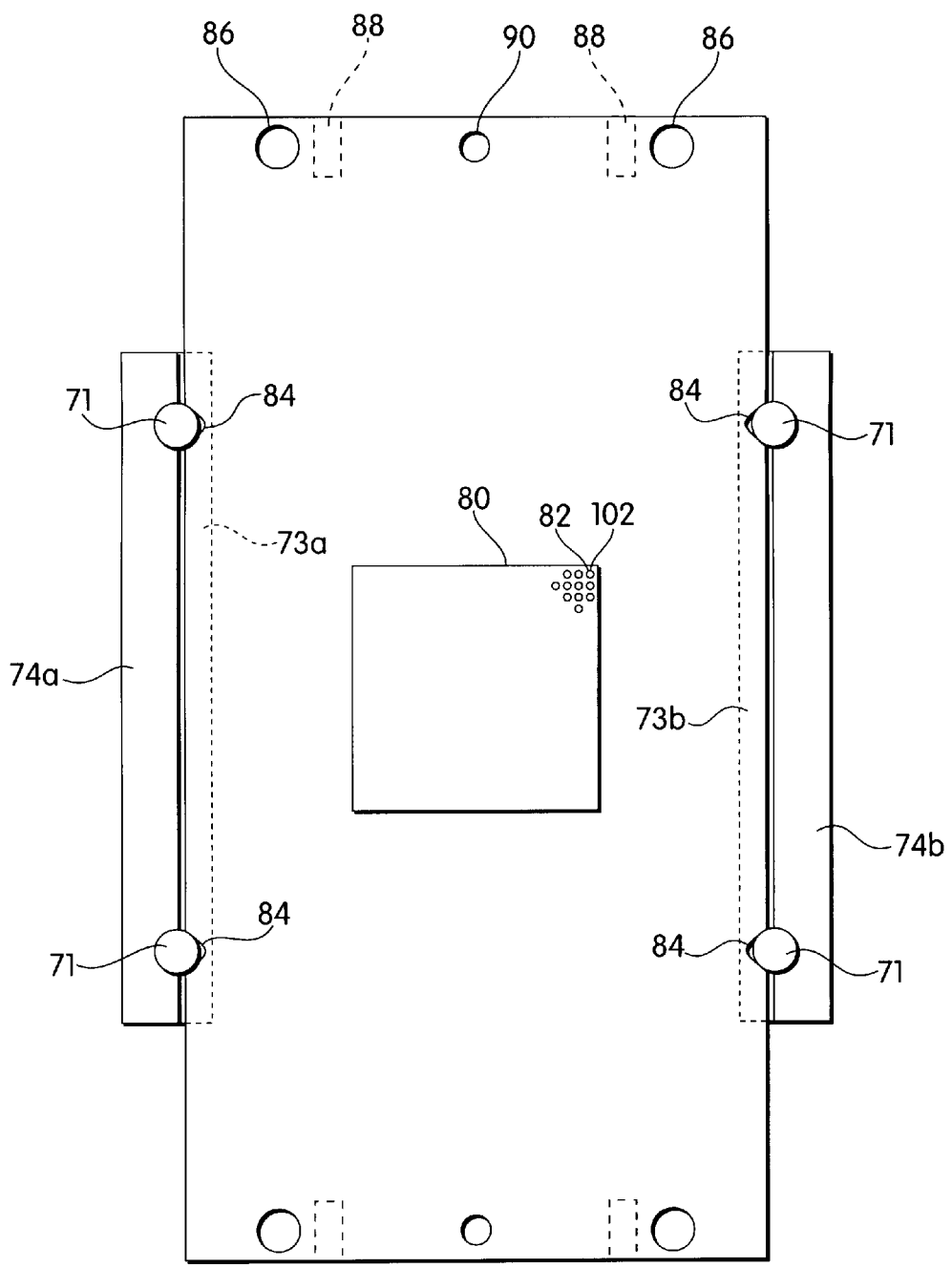
FIG. 13 is a plan view of the carrier plate gripped on the side edges by the pattern head grippers.

Carrier plate 18 includes two alignment holes 90 at opposite ends which are about 0.125 inches in diameter. Alignment holes 90 mate with alignment pins 90a (FIGS. 10 and 18) to align the carrier plate 18 with the pattern head 104 and ball placement head 126. Four holes 86 are located at the corners of carrier plate 18 and are about 0.191 inches in diameter. Holes 86 provide clearance for protruding screw heads extending from pattern head 104 and ball placement head 126. Recesses 88 on the ends of carrier plate 18 receive pins 17 from support fingers 16a and 16b. Recesses 84 located along the sides of carrier plate 18 receive protrusions 71 (FIG. 13) from pattern head grippers 74a/74b and ball placement grippers 127a/127b. Although film 98 is preferably made of Kapton™, other suitable stiff plastic films can be used such as Mylar™. In addition, metallic foils or films can be employed. Furthermore, top plate 92 can be made of metal instead of printed circuit board material. In such a case, the holes 82 through the metallic top plate 92 can be etched. Also, the size of array 80 can be varied depending upon the maximum number of solder balls required for placement on parts 72. For example, the array depicted in FIG. 2 has 441 holes while another common array contains 1089 holes. In fact, array 80 can cover most of carrier plate 18. Multiple arrays 80 can also be formed within carrier plate 18 for multiple parts 72. Finally, the dimensions of carrier plate 18 can be varied depending upon the application at hand, for example, enlarged if used for multiple parts.

Figure 7:
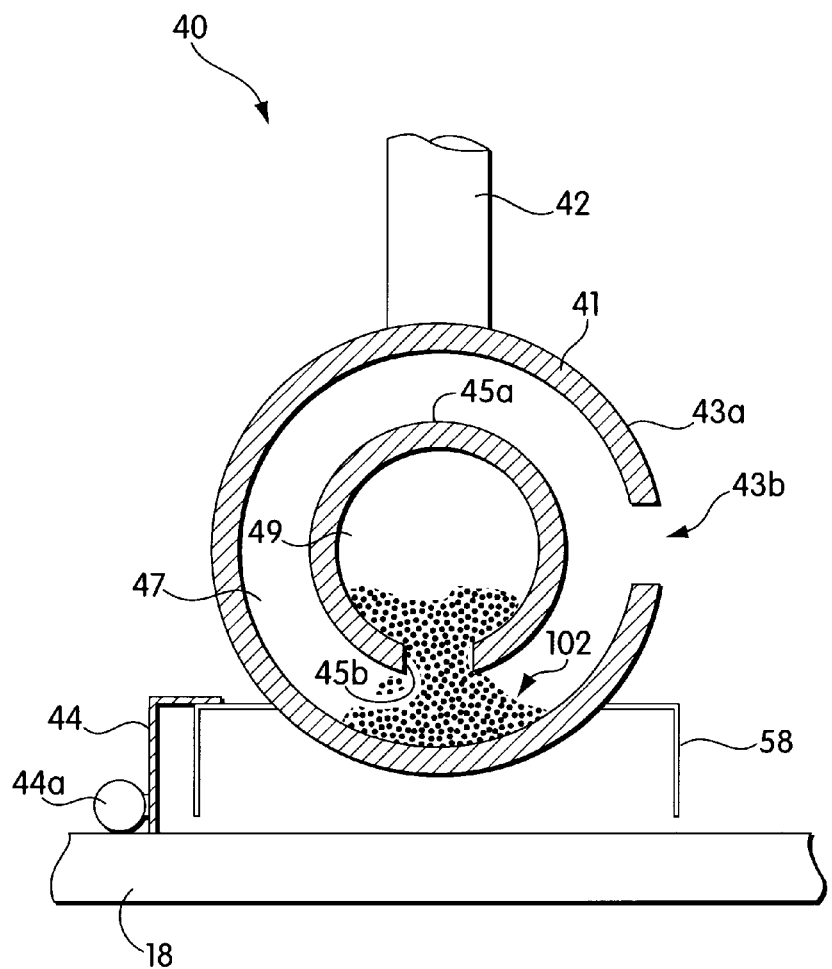
FIG. 7 is a partial sectional view of a ball feed positioned above a carrier plate.
Figure 8:
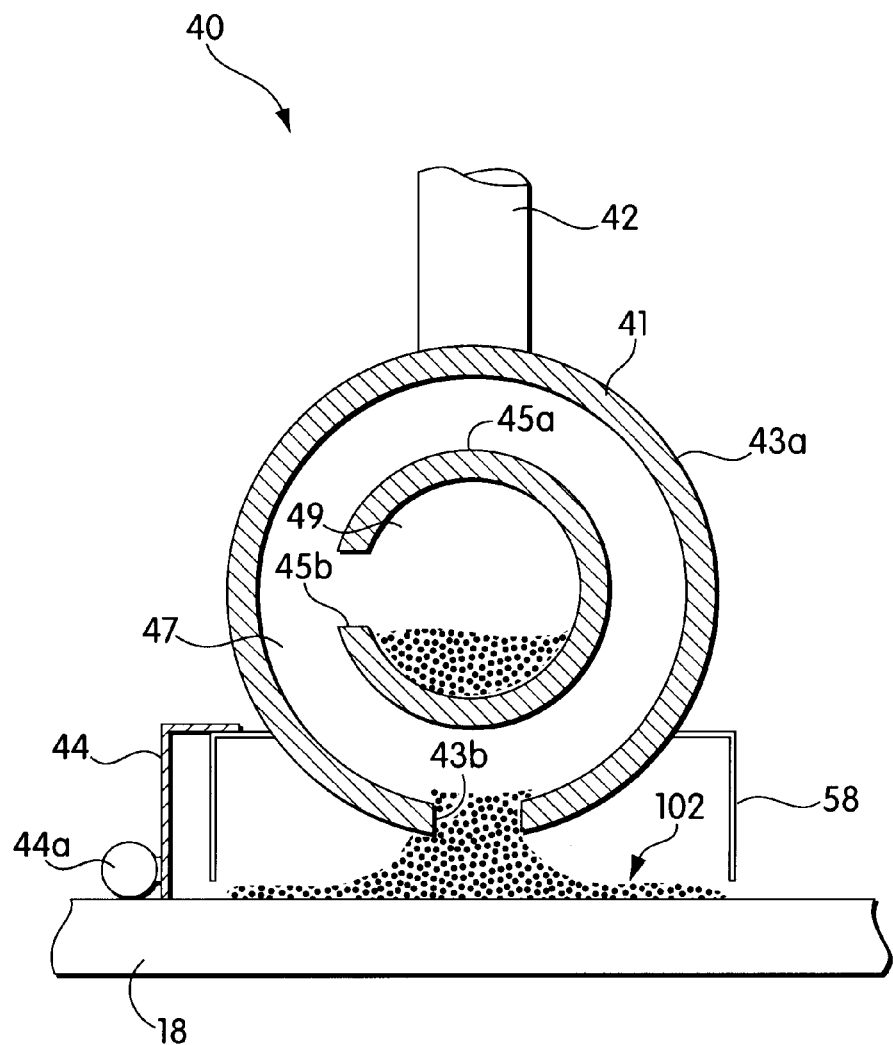
FIG. 8 is a partial sectional view of the ball feed delivering solder balls onto the carrier plate.

Referring to FIGS. 1, 7 and 8, each ball feed 40 includes a supply tube 42 for supplying the ball feed 40 with solder balls 102. The solder balls 102 travel downwardly by gravity into the inner chamber 49 of feed member 41. The wall 45a surrounding inner chamber 49 has an opening 45b which allows the solder balls 102 to escape into outer chamber 47. The wall 43a surrounding outer chamber 47 has an opening 43b positioned 90E from opening 45b. When feed member 41 is rotated to move opening 43b to face carrier plate 18, the quantity of solder balls 102 held in outer chamber 47 spills onto carrier plate 18 over the array 80 of holes 82. Meanwhile, the opening 45b is rotated to the side such that solder balls 102 are collected within inner chamber 49. Each ball feed 40 includes an enclosure 58 surrounding the ball feed 40 which is positioned sufficiently close to carrier plate 18 to contain most of the solder balls 102 over the array 80 of holes 82. A wiping element 44 positioned at a 45E angle adjacent to ball feed 40 then wipes excess solder balls 102 from the carrier plate 18 as the carrier plate 18 is indexed by carousel 14. Preferably, wiping element 44 is formed from soft compliant clear plastic but, alternatively, can be made of rubber or metal such as aluminum, brass, steel, etc. A wheel 44a provides the proper spacing between wiping element 44 and carrier plate 18. In alternate embodiments, either an air jet can be used to remove excess solder balls 102, or carrier plate 18 can be tilted. Although the ballfeed stations preferably progressively fill carrier plate 18 with solder balls 102, in cases where carrier plate 18 is already filled with the required solder balls 102 before reaching ball feed station 30, apparatus 10 can be programmed to inspect carrier plate 18 as it leaves each ball feed station so that if carrier plate 18 is properly filled with solder balls 102, the carrier plate 18 can bypass the remaining ball feed stations.

Figure 9:
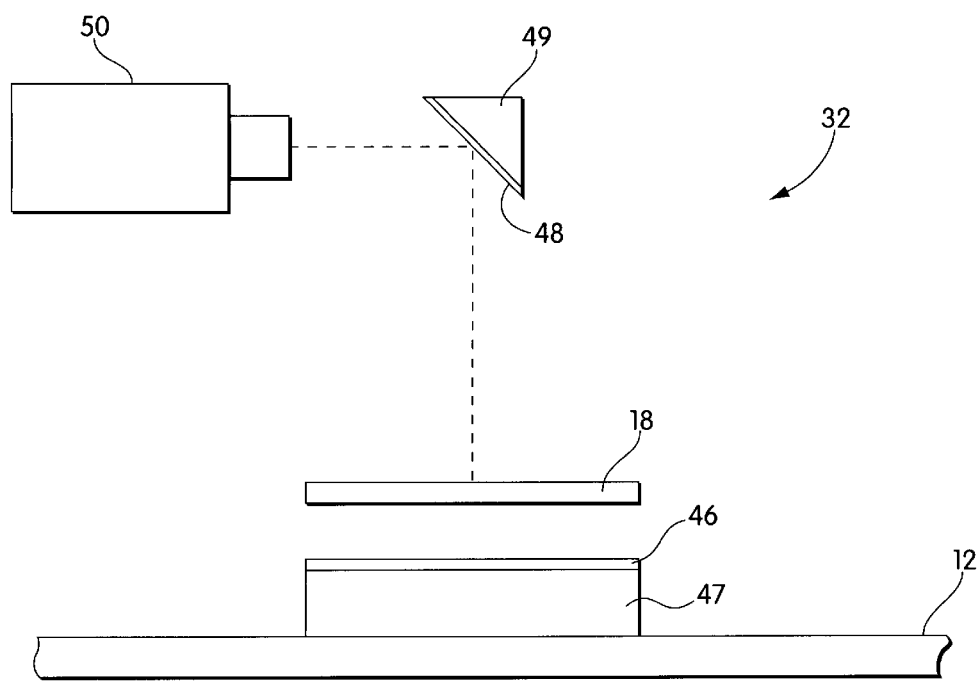
FIG. 9 is a schematic side view of the first sensing system.

Referring to FIG. 9, the first sensing station 32 includes a planar light source 46 which is positioned under carrier plate 18 for backlighting carrier plate 18. Light source 46 is mounted on a flat block 47 positioned on table top 12. Camera 50 is preferably a CCD camera and is horizontally mounted above carrier plate 18. A mirror 48 is mounted above carrier plate 18 at a 45E angle to carrier plate 18 on a bracket 49 which allows camera 50 to view the array 80 of holes 82 on carrier plate 18. Light source 46 provides a pulse of light long enough to allow camera 50 to view array 80. Although camera 50 is preferably positioned horizontally, camera 50 can alternatively be positioned vertically above carrier plate 18. In such a case, mirror 48 is omitted.

Referring to FIGS. 10, 11, 12, and 13, pattern head assembly 52 includes a pattern head 104 mounted to the lower end 124 of pattern head assembly 52. Pattern head 104 has a pattern of vertically positioned pins 108 for pushing an unneeded pattern 83 of solder balls 102 from carrier plate 18 as seen in FIG. 6. The pattern of pins 108 in pattern head 104 is arranged to correspond to pattern 83. The pins 108 are oriented such that end 108a and rounded tip 107 are facing downward. Pins 108 are held in position by plates 110, 112 and 114 which are made of gold-plated printed circuit board material. Plates 110, 112 and 114 are mounted between end pieces 116 and include an array 80 of holes 82 therethrough corresponding to the array 80 of holes 82 on the carrier plate 18. Plates 110 and 112 are spaced apart from plate 114 by two spacers 113. A shoulder 105 on pin 108 is positioned above plate 112 in a cavity between spacers 113 and limits the amount that pins 108 can move up and down. Ends 108b of pins 108 rest against a sandwich formed of hard rubber 118, shim stock 120 and foam 122. This sandwich provides enough movement for each pin 108 to allow the pins 108 to be self-aligning with the corresponding holes 82 within carrier plate 18. A spring-loaded stripper plate 106 is positioned over the tips 107 of pins 108 for protecting pins 108 as well as for keeping them in proper alignment. Stripper plate 106 also includes an array 80 of holes 82 corresponding to those in the carrier plate 18. Stripper plate 106 moves upwardly against plate 10 in the direction of arrow 103 when carrier plate 18 is pushed upwardly against stripper plate 106 by pattern head grippers 74a/74b. Stripper plate 106 keeps carrier plate 18 perpendicular to pins 108 to keep pins 108 from jamming within carrier plate 18. Plates 106, 110, 112 and 114 are gold-plated so that they can be electrically grounded to reduce static electricity as well as to prevent damage to parts 72. Plates 106, 110, 112 and 114 are mounted along two alignment pins 90a such that the array 80 of holes 82 on the plates are in alignment with each other.

Grippers 74a/74b pivot about pivot points 75a and 75b, respectively, to allow grippers 74a/74b to grip and release carrier plate 18 as depicted by arrows 77. Grippers 74a/74b have protrusions 71 (FIG. 13) which engage recesses 84 for aligning carrier plate 18 within grippers 74a/74b. Bottom portions 73a and 73b support carrier plate 18 from the bottom. Grippers 74a/74b slide up and down relative to pattern head 104 and are driven by a crank slider mechanism which in turn is driven by a brushless servo motor coupled through a gear reducer.

In order to remove the pattern of unneeded solder balls 102 from the array 80 of holes 82 in carrier plate 18, carrier plate 18 is brought upwardly in the direction of arrows 101 by grippers 74a/74b. Carrier plate 18 engages and pushes stripper plate 106 upwardly in the direction of arrow 103 such that pins 108 protrude through stripper plate 106. The pattern of pins 108 push a corresponding pattern 83 of unneeded solder balls 102 through carrier plate 18. This leaves behind only a pattern 81 of desired solder balls 102 within array 80 as depicted in FIG. 6.

Figure 14:
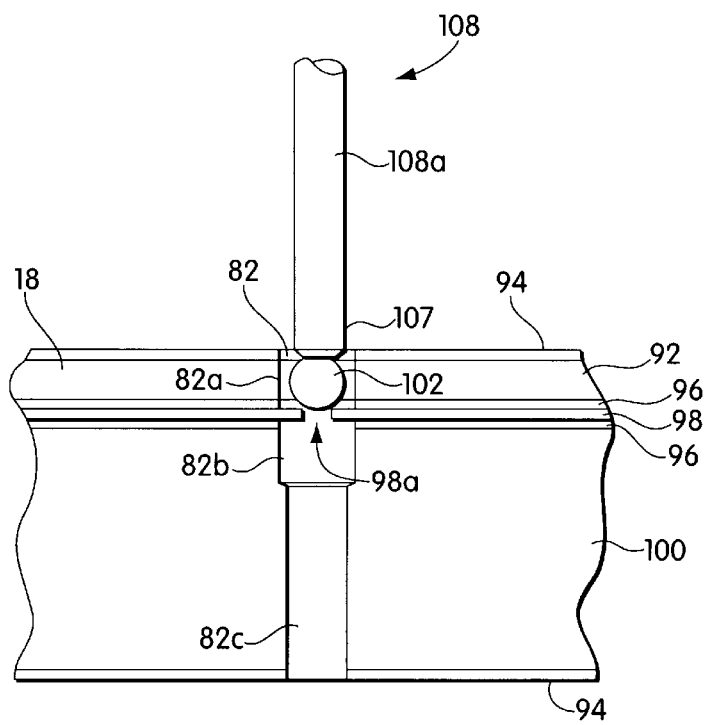
FIGS. 14, 15 and 16 depict a single pattern head pin pushing a solder ball through the carrier plate.
Figure 15:
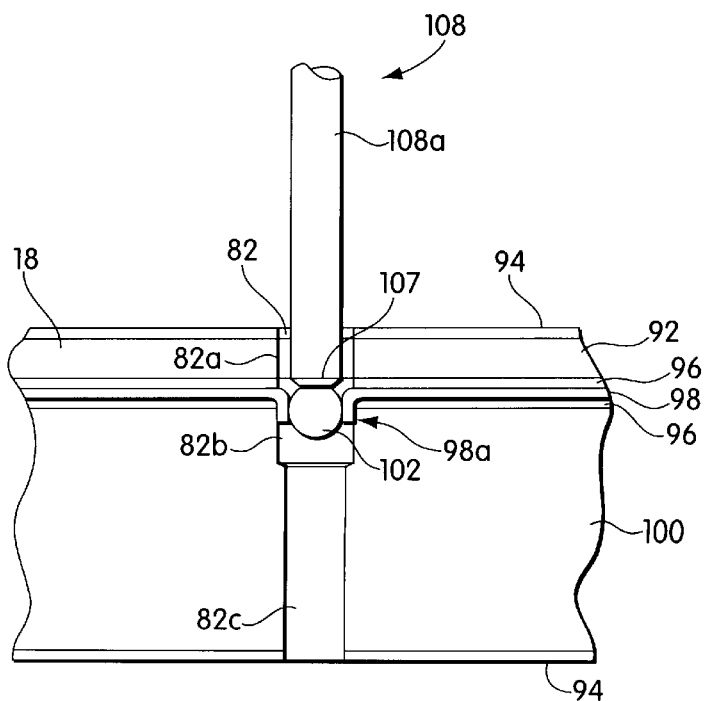
Figure 16:
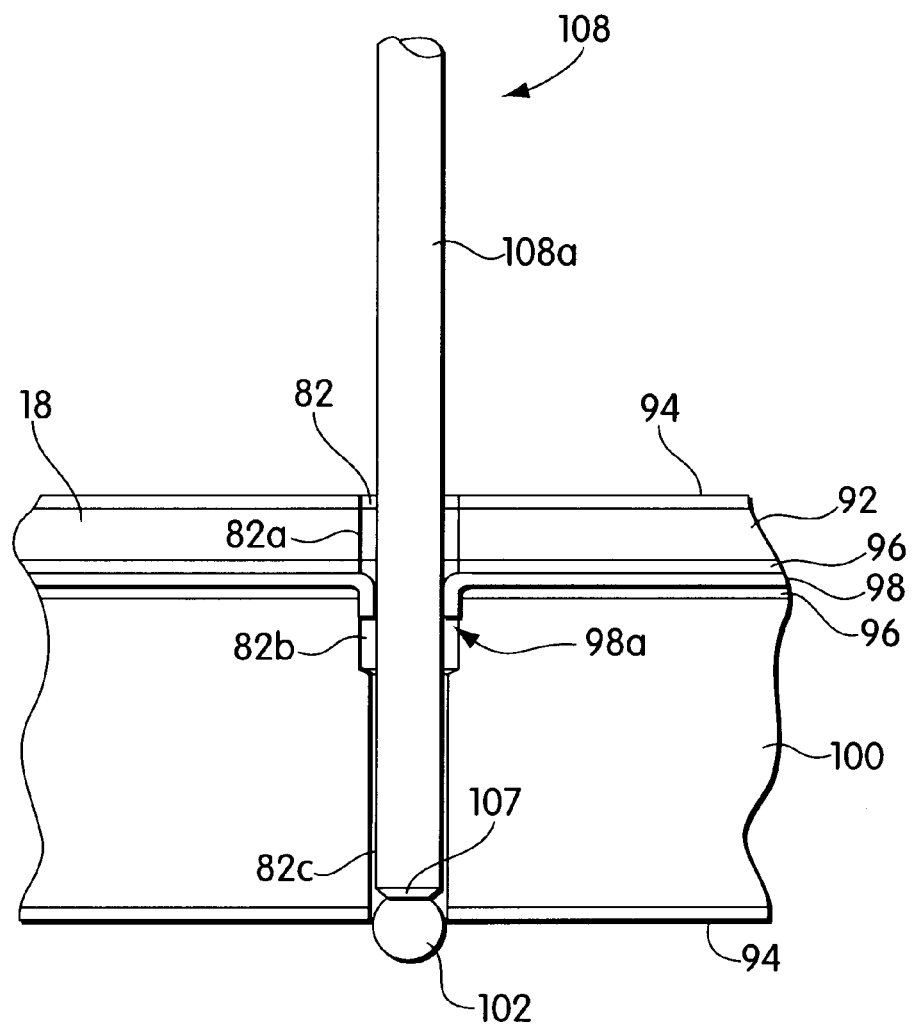

FIGS. 14, 15 and 16 depict a single solder ball 102 pushed through carrier plate 18. Referring to FIG. 14, solder ball 102 is supported within the first portion 82a of hole 82 by film 98. The tip 107 of pin 108 begins to engage solder ball 102. In FIG. 15, pin 108 pushes solder ball 102 into the second portion 82b of hole 82. The force of pin 108 causes film 98 to flex downwardly pushing solder ball 102 through opening 98a. In FIG. 16, solder ball 102 is pushed through the third portion 82c of hole 82 by pin 108 and out from carrier plate 18.

By including a full array 80 of holes 82 within plates 110, 112 and 114 of pattern head 104, the configuration of pins 108 in pattern head 104 can be changed to accommodate different parts 72. The advantage of this is that a large variety of parts 72 can be processed without requiring a large inventory of special tooling to be kept on hand. If a quick change of parts 72 is desired, a second pattern head 104 can be kept on hand so that processing a different part merely requires unbolting and replacing the pattern head 104 on the pattern head assembly 52.

Figure 17:
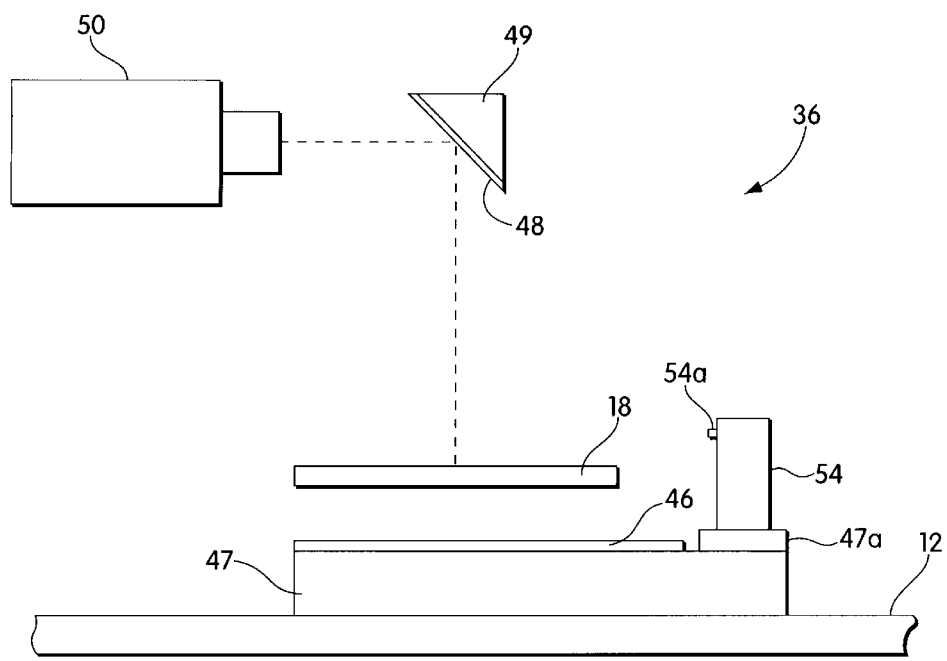
FIG. 17 is a schematic side view of the second sensing system.

Referring to FIG. 17, the second sensing station 36 includes a planar light source 46 positioned below carrier plate 18 for backlighting carrier plate 18. Light source 46 is mounted on block 47. Camera 50 is horizontally mounted above carrier plate 18. A mirror 48 is mounted above carrier plate 18 at a 45° angle with bracket 49. A second light source 54 having a light emitting element 54a is mounted on block 47a above and off to the side of the carrier 18 for front lighting carrier 18. Backlighting the carrier plate 18 with light source 46 allows camera 50 to view whether the solder balls 102 in the array 80 of holes 82 of the carrier plate 18 are in the desired pattern 81 (FIG. 6). Front lighting the carrier plate 18 with light source 54 allows camera 50 to see whether any stray solder balls 102 are resting on top of carrier plate 18 so that the stray solder balls 102 can be removed by an airjet or wipers. Light sources 54 and 46 provide a pulse of light long enough to allow camera 50 to view carrier plate 18.

Figure 10:
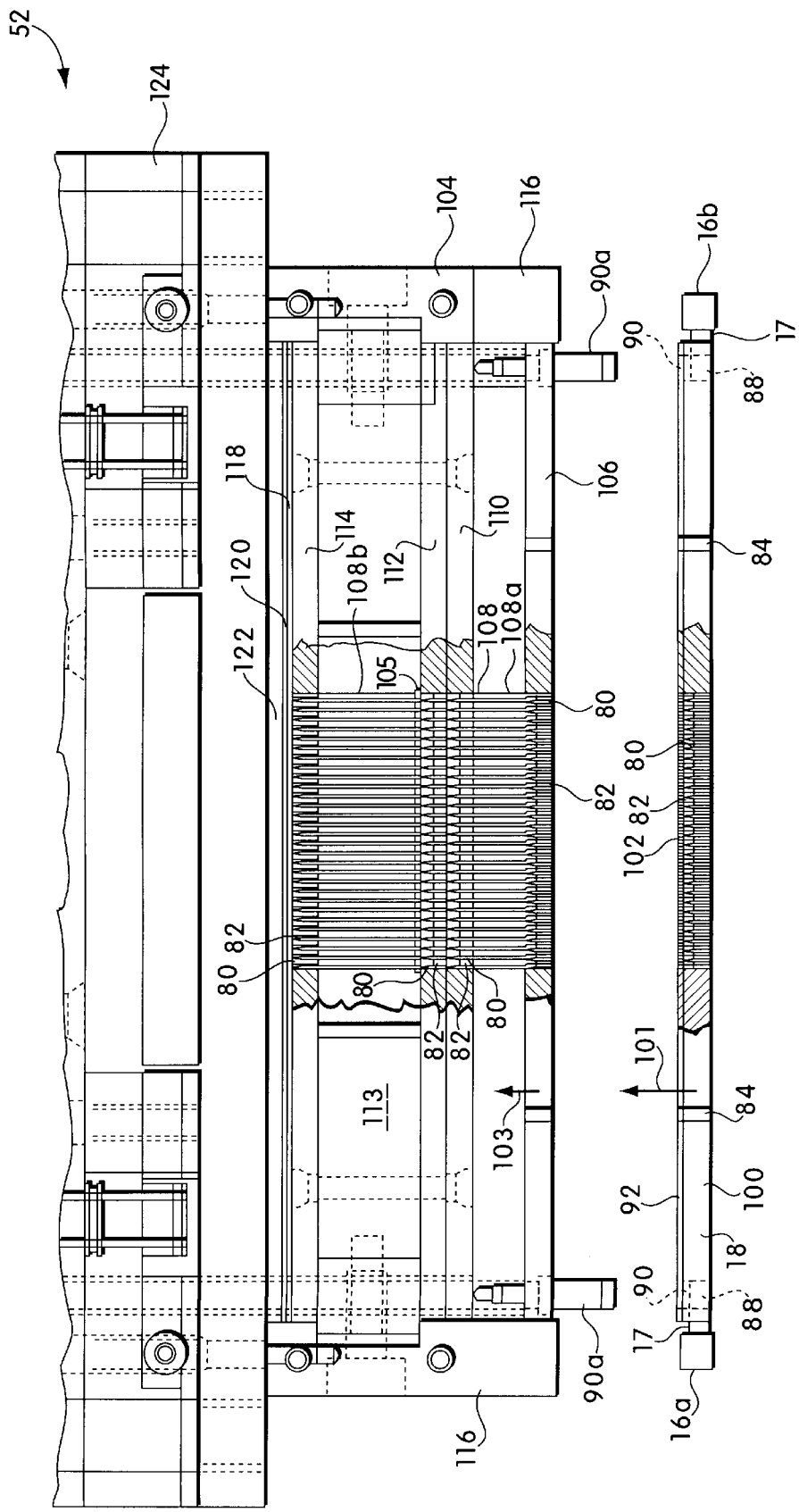
FIG. 10 is a partial side sectional view of the pattern head positioned above the carrier plate.
Figure 11:
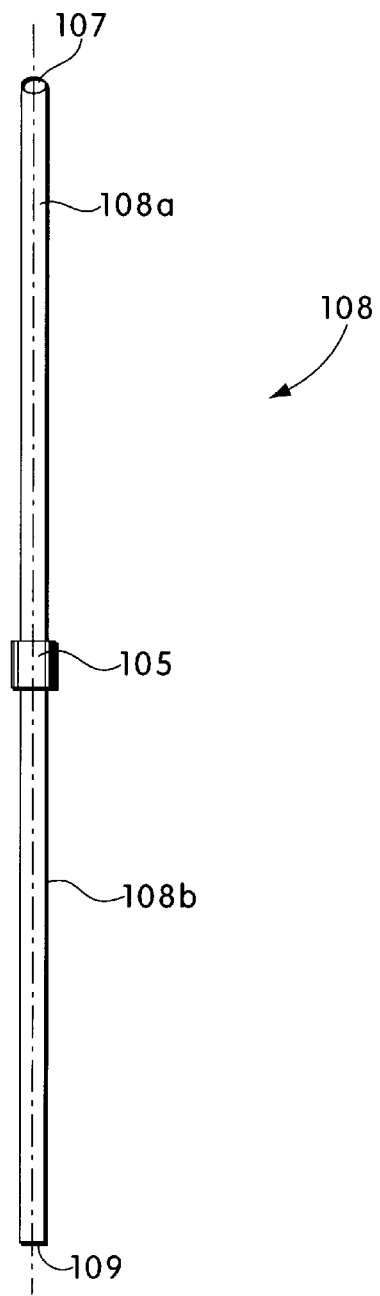
FIG. 11 is a side view of a pattern head/ball placement head pin.
Figure 12:
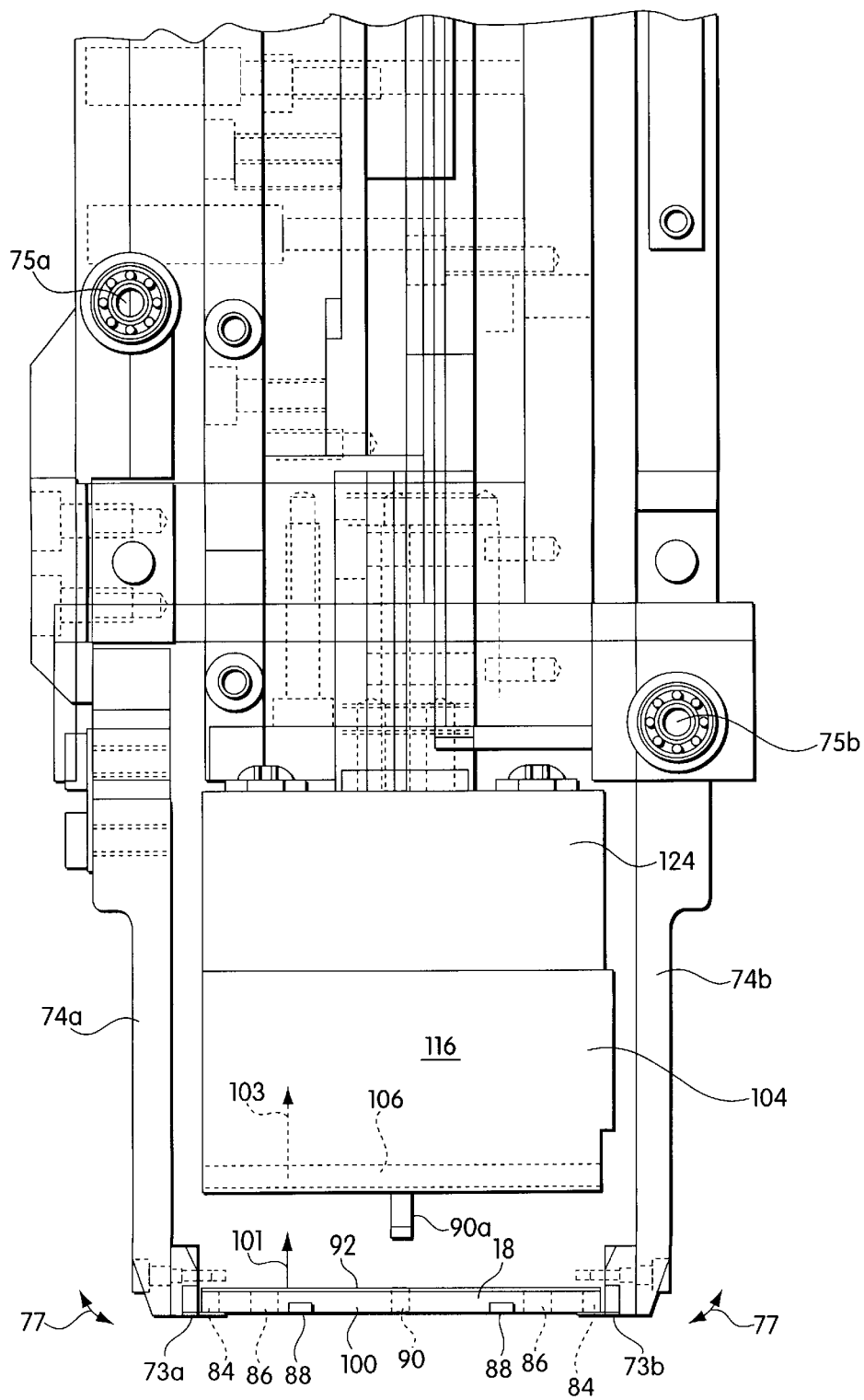
FIG. 12 is an end view of the pattern head assembly in which the carrier plate is held by the pattern head grippers on the side edges of the carrier plate.
Figure 19:
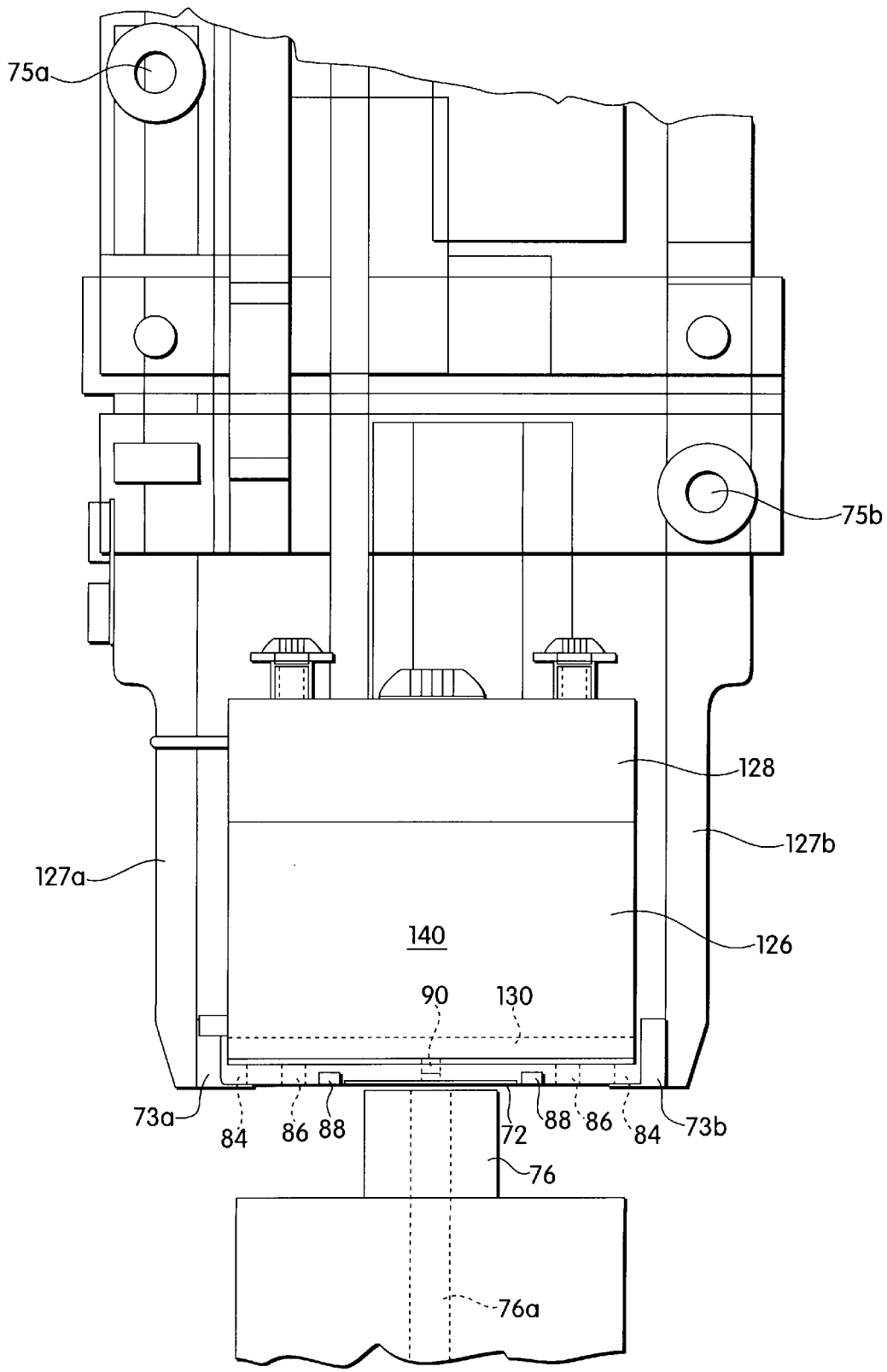
FIG. 19 is an end view of the ball placement head assembly in which the carrier plate is held by the ball placement head grippers on the side edges with a semiconductor substrate being positioned for ball placement by a vacuum chuck.

Referring to FIGS. 18 and 19, ball placement head 126 is mounted to the lower portion 128 of ball placement head assembly 56. Ball placement head 126 includes an array of pins 108 corresponding to the array 80 of holes 82 in carrier plate 18. The ends 108b and tips 109 of pins are positioned downwardly. Tips 109 (FIG. 11) are cup shaped for more accurate placement of solder balls 102. Pins 108 are held in position by plates 132, 134 and 138 which are similar to plates 110, 112 and 114 of pattern head 104. The sandwich of hard rubber 118, shim stock 120 and foam 122 is positioned above pins 108 to allow the pins to be self-aligning and vertically compliant. Two spacers 136 separate plate 138 from plates 132 and 134. Plates 132, 134 and 138 are mounted between end pieces 140. Alignment pins 90a allow carrier plate 18 to be properly aligned with ball placement head 126. A spring-loaded stripper plate 130 protects and aligns the tips 109 of pins 108. Stripper plate 130 is similar to stripper plate 106 (FIG. 10). Ball placement head assembly 56 includes grippers 127a/127b for gripping carrier plate 18 and lowering carrier plate 18 over part 72. Grippers 127a/127b pivot about pivot points 75a and 75b, respectively. Ball placement head 126 and grippers 127a/127b slide up and down relative to ball placement head assembly 56 and are each driven by a crank slider mechanism similar to that on the pattern head assembly 52. In addition, the vacuum chuck 76 positioned below ball placement head assembly 56 is also driven by a crank slider mechanism.

In operation, after grippers 127a/127b lower carrier plate 18 over part 72, ball placement head 126 then moves downwardly relative to carrier plate 18. As stripper plate 130 engages carrier plate 18, stripper plate 130 is pushed upwardly thereby exposing pins 108. The tips 109 of pins 108 engage the pattern 81 of solder balls 102, pushing them downwardly through carrier plate 18 onto part 72. Since pins 108 are vertically compliant, pins 108 can compensate for an uneven or slightly tilted surface of part 72. Once the solder balls 102 are in position, the carrier plate 18 and the ball placement head 126 are moved upwardly.

Figure 20:
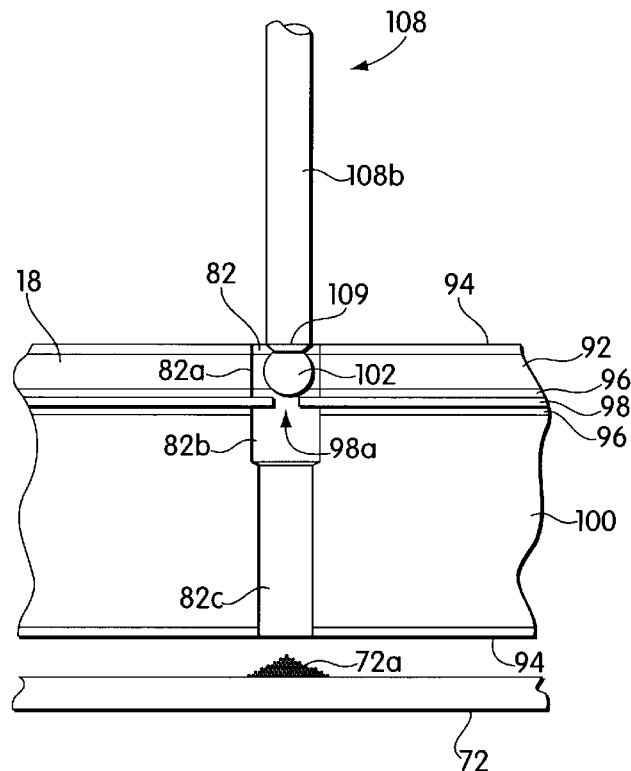
FIGS. 20, 21, 22 and 23 depict a single ball placement head pin pushing a solder ball from the carrier plate onto a semiconductor substrate.
Figure 21:
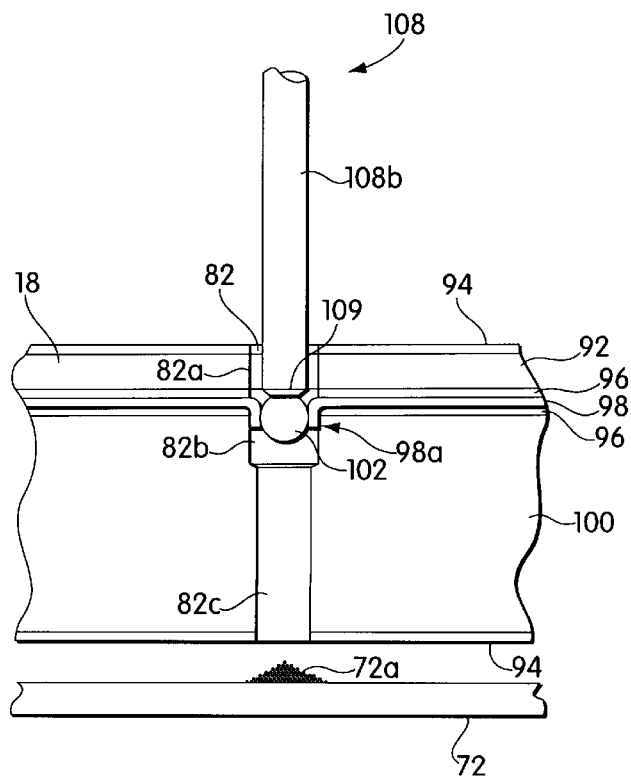
Figure 22:
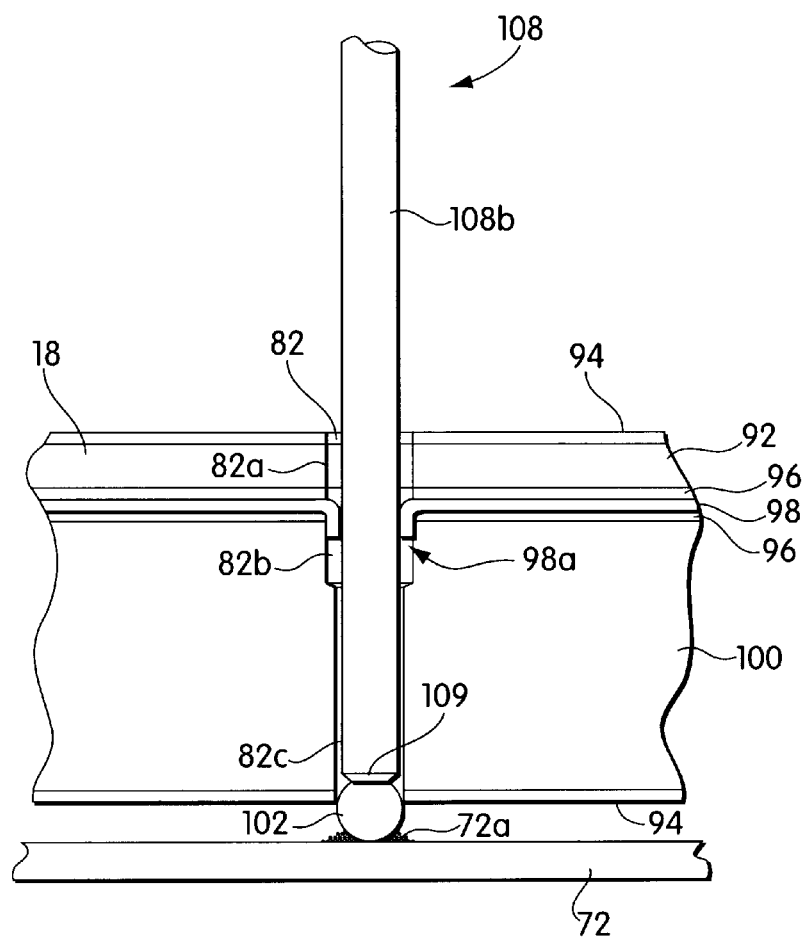
Figure 23:
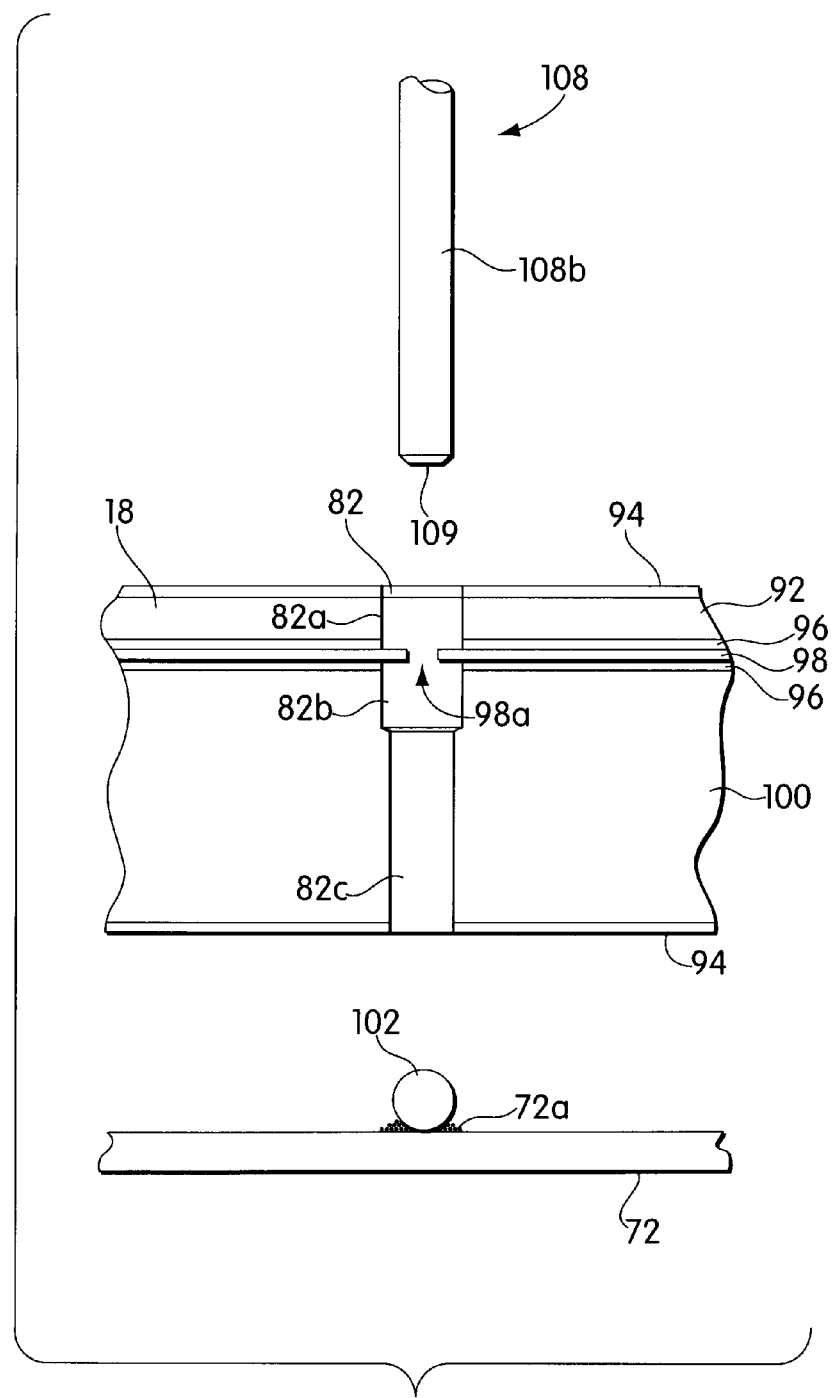

FIGS. 20, 21, 22 and 23 depict a single solder ball 102 pushed through carrier plate 18 onto part 72. Referring to FIG. 20, carrier plate 18 is positioned above part 72. A blob of flux 72a is positioned below hole 82. Solder ball 102 is supported within the first portion 82a of hole 82 by film 98. The tip 109 of pin 108 begins to engage solder ball 102. In FIG. 21, pin 108 pushes solder ball 102 through opening 98a in film 98 into the second portion 82b of hole 82. In FIG. 22, solder ball 102 is pushed through the third portion 82c of hole 82 onto the blob of flux 72a on part 72. The flux 72a causes solder ball 102 to stick to part 72. In FIG. 23, pin 108 and carrier plate 18 are moved upwardly away from part 72. In situations where flux is not needed, blobs of inert material can be used to cause solder balls 102 to stick to part 72.

Although carrier plate 18 and ball placement head 126 both preferably include a generic array 80 of holes 82 and pins 108 requiring the use of the pattern head 104 to create the desired pattern 81 of solder balls 102, alternatively, carrier plate 18 and ball placement head 126 can have an array of holes 82 and pins 108 which correspond to the exact desired pattern of solder balls 102 to be placed upon part 72. In such a case, sensing station 32 and pattern head station 34 can be omitted. However, in order to accommodate different parts, carrier plates and ball placement heads having the exact configuration for each different part must be kept on hand.

Figure 24:
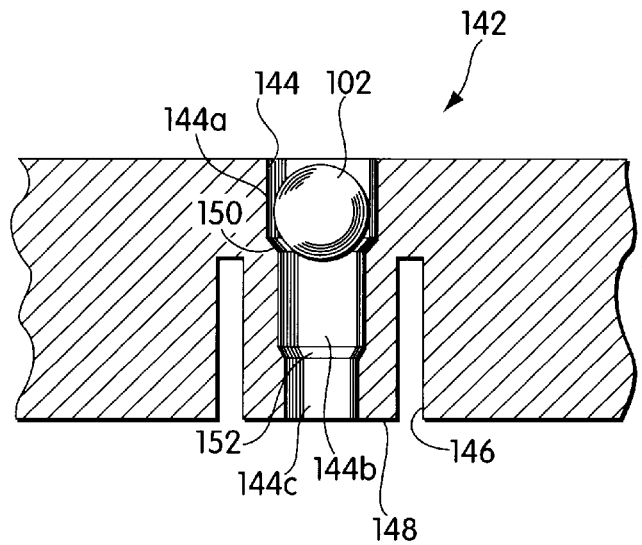
FIG. 24 is a side sectional view of a portion of another preferred carrier plate.
Figure 25:
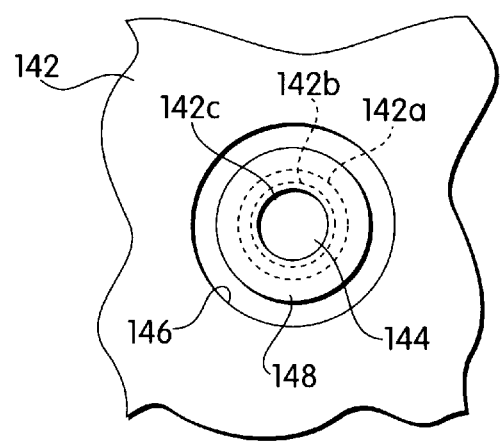
FIG. 25 is a bottom view of a portion of the carrier plate of FIG. 24.

Referring to FIGS. 24 and 25, carrier plate 142 is another preferred carrier plate. Carrier plate 142 differs from carrier plate 18 in that it is made from one material. An array of holes 144 are formed through carrier plate 142. Each hole 144 has a first portion 144a for capturing a solder ball 102. A second portion 144b with a smaller diameter than first portion 144a is capable of resiliently holding a solder ball 102 if pushed into the second portion 144b by a pin 108. This allows carrier plate 142 to be preloaded with solder balls 102 on a separate machine than the ball placement machine because the carrier plate 142 can be transported and even held upside down without losing the solder balls 102. Splitting the operation of apparatus 10 into two different machines would increase the speed at which solder balls 102 can be placed onto parts 72. A concentric slot 146 on the bottom of carrier plate 142 forms a thin wall 148 surrounding second portion 144b and a third portion 144c. This allows the second portion 144b to expand when the solder ball 102 is pushed in. The third portion 144c has a diameter smaller than second portion 144c and resiliently expands to allow solder ball 102 to pass through when pushed by a pin 108. Carrier plate 142 is preferably formed of plastic but, alternatively, can be made of metal or a lamination.

Figure 26:
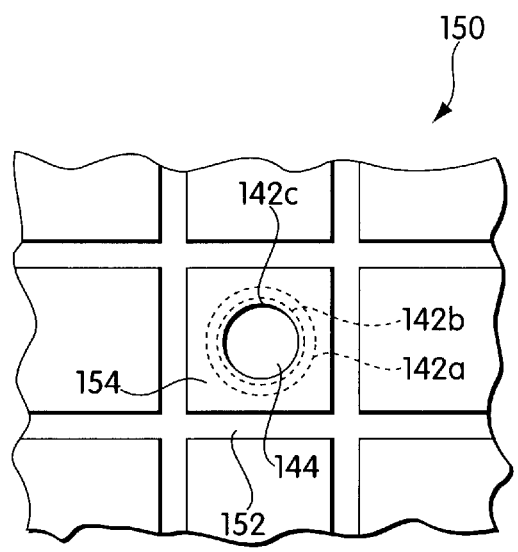
FIG. 26 is a bottom view of a portion of still another preferred carrier plate.

Referring to FIG. 26, carrier plate 150 is another preferred carrier plate which differs from Carrier plate 142 in that the bottom of carrier plate 150 has criss-crossing slots 152 forming a thin wall portion 154 about the second 144b and third portions 144c of hole 144. Slots 152 are preferably molded into the carrier plate 150 but, alternatively, can be saw cut. In another preferred embodiment, the second section 144b of holes 144 can be omitted with the solder balls being held within carrier plate 150 by static electricity.

Figure 27:
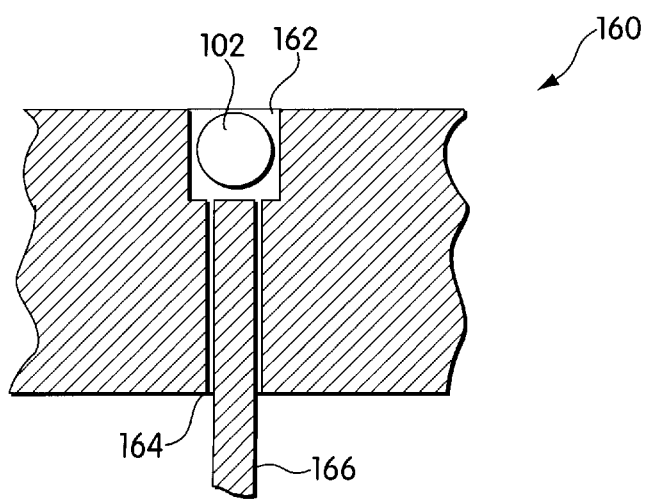
FIG. 27 depicts a placement apparatus used to push a solder ball from a hole in a carrier plate onto a semiconductor substrate in accordance with one embodiment of the present invention.

Referring to FIG. 27, carrier plate 160 is another preferred carrier plate for use in another embodiment of the present invention. A cross-sectional view showing one hole of the carrier plate 160 is shown in FIG. 27. The hole in the carrier plate 160 is shown containing a solder ball 102. The hole has an upper portion 162 and a lower portion 164. The diameter of the upper portion of the hole is greater than the diameter of the solder ball 102, while the diameter of the lower portion of the hole is less than the diameter of the solder ball to prevent the solder ball from entering the lower portion of the hole. Carrier plate 160 is designed for use with a solder ball placement apparatus in accordance with one embodiment of the present invention in which the semiconductor substrate that is to receive the solder balls is disposed upside down above the carrier plate so that the solder balls can be pushed out of the holes and against the top surface of the semiconductor substrate. FIG. 27 shows a pin 126 of a placement apparatus used to push the solder ball from the hole onto a semiconductor substrate.

Figure 28:
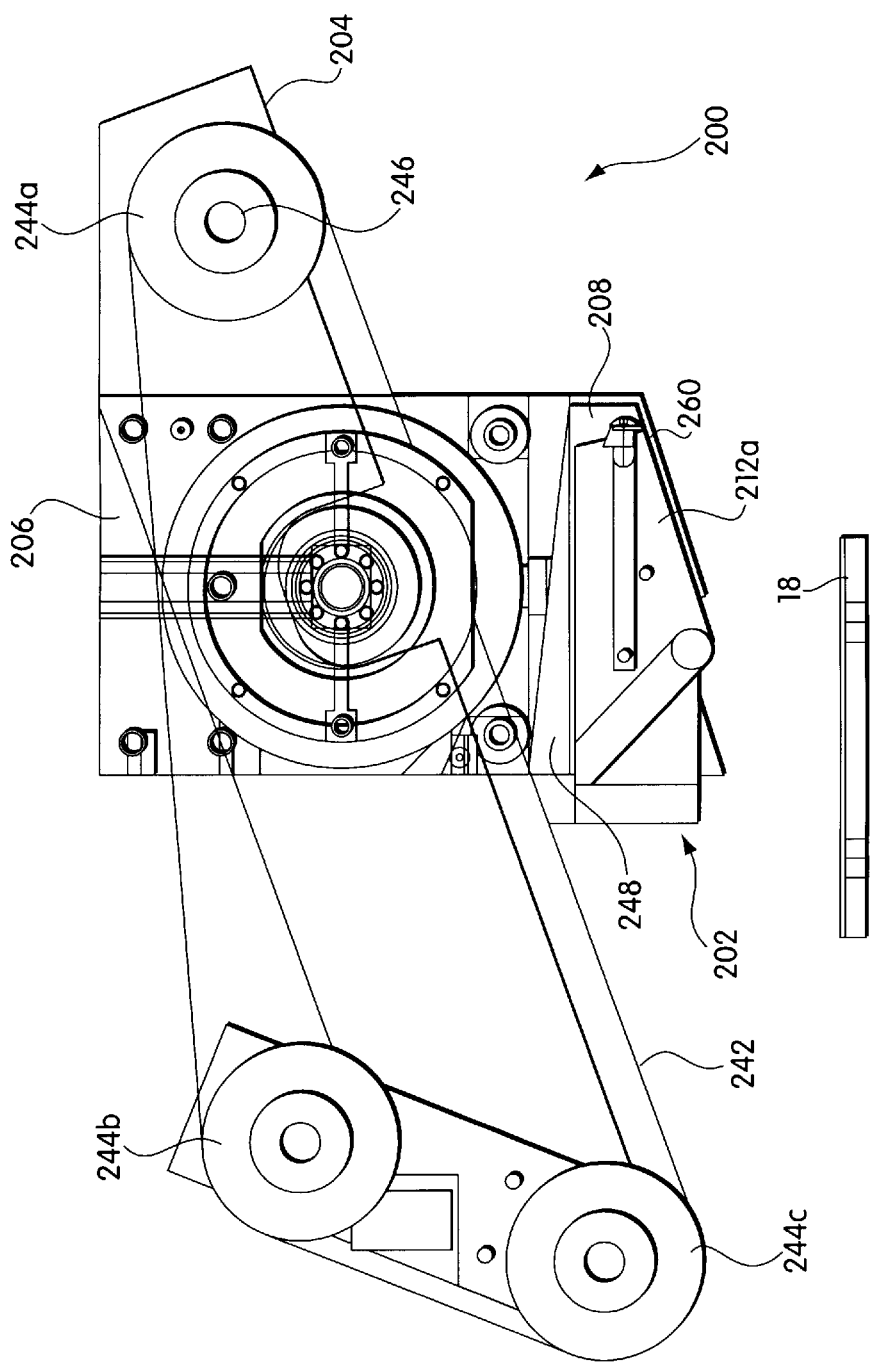
FIG. 28 is a partial side sectional view of a ball feed dispenser in accordance with one embodiment of the present invention in a first operational position.

In another aspect of the present invention, an improved method and apparatus for filling carrier plates with solder balls is provided. One embodiment of a solder ball dispenser 200 used for filling a carrier plate 18 with solder balls is shown in FIG. 28. The solder ball dispenser 200 may be used in the solder ball displacement apparatus 10 in place of the five ball feed stations 22, 24, 26, 28 and 30 shown in FIG. 1. Because of the filling accuracy provided by the solder ball dispenser 200, one solder ball dispenser can generally be used in the solder ball displacement apparatus. However, for some applications, it may be desirable to use more than one solder ball dispenser 200 in a displacement apparatus.

The solder ball dispenser 200 will now be described further with reference to FIGS. 28–37. FIG. 28 shows a cross-sectional side view of the solder ball dispenser in a predispense operational state. The solder ball dispenser 200 includes three primary components including: a solder ball retaining device 202; a drive mechanism 204 for moving the solder ball retaining device across a carrier plate 18, and a ball feed device 206 used to fill the solder ball retaining device with solder balls.

The solder ball dispenser 200 operates as follows. A predetermined quantity of solder balls is dispensed from the ball feed device 206 into the ball retaining device 202. The carrier plate is then tilted at an angle (see, FIG. 29), and the solder ball retaining device is moved across the carrier plate under the control of the drive mechanism to a post dispense position shown in FIG. 30. The movement of the solder ball retaining device across the carrier plate allows the solder balls to fall across the upper surface of the carrier plate at a controlled velocity, filling each hole in the carrier plate 18 with a solder ball. As in the previous embodiments, a wiper may 30 be used to wipe any stray solder balls from the top surface of the carrier plate as the carrier plate is loaded into position beneath the solder ball dispenser and as the carrier plate is unloaded from the solder ball dispenser. Also, in embodiments of the present invention, an inspection system may be used to inspect the carrier plate before and after the dispensing of solder balls onto the carrier plate.

Figure 31:
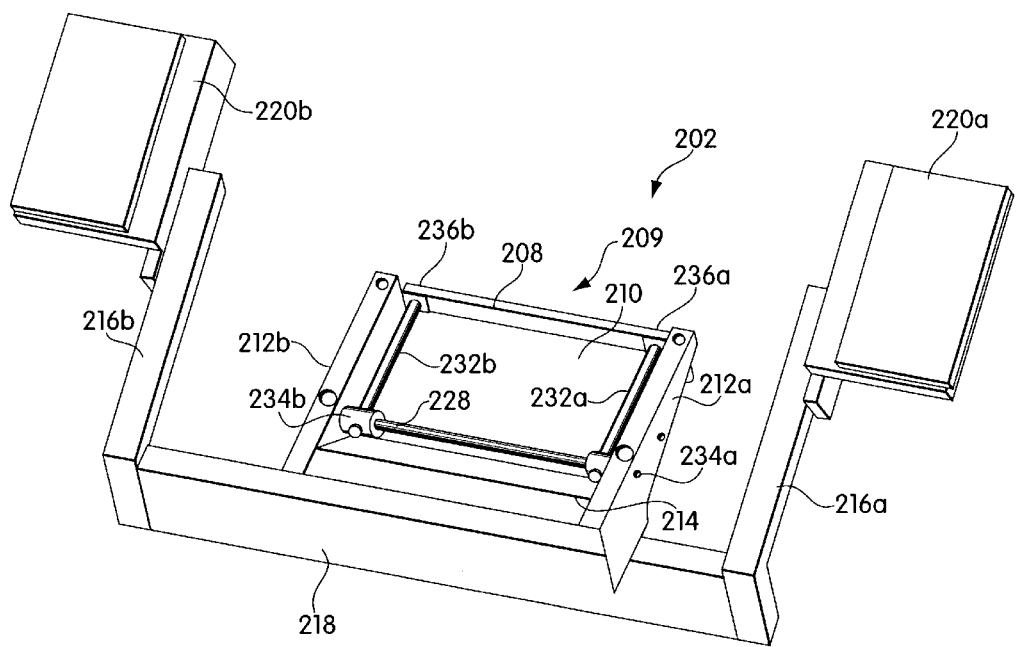
FIG. 31 is a perspective view of a solder ball retaining device used in the ball feed dispenser of FIG. 28.
Figure 32:
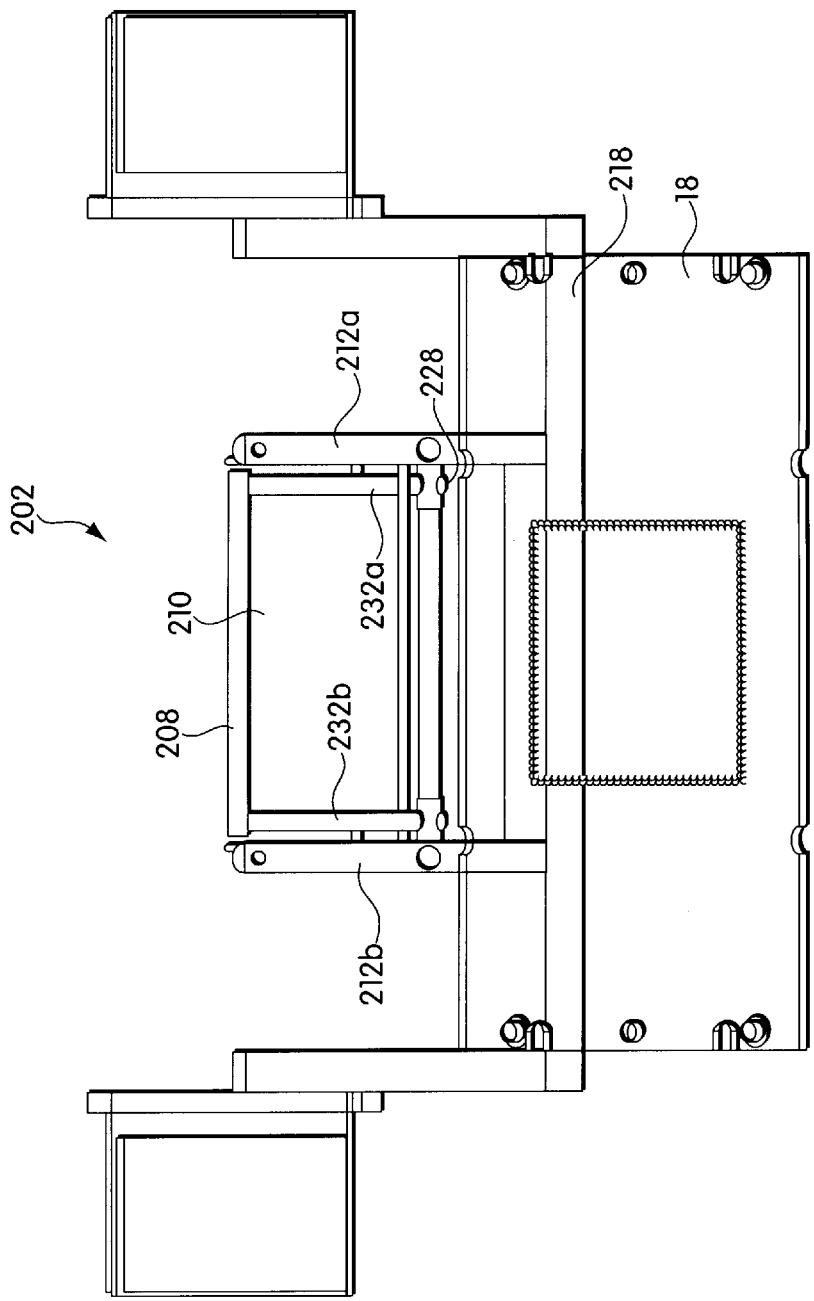
FIG. 32 is a top view of the solder ball retaining device of FIG. 31 in a first operational position.
Figure 33:
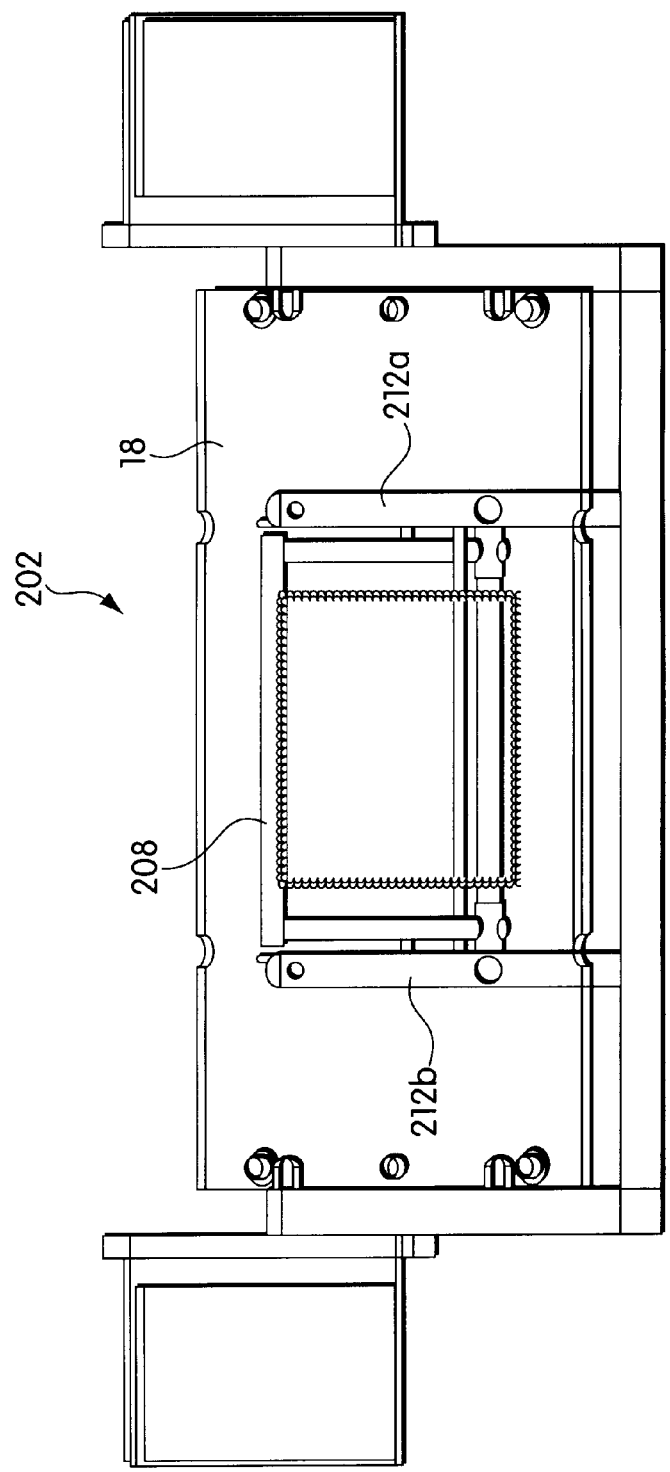
FIG. 33 is a top view of the solder ball retaining device of FIG. 31 in a second operational position.
Figure 34:
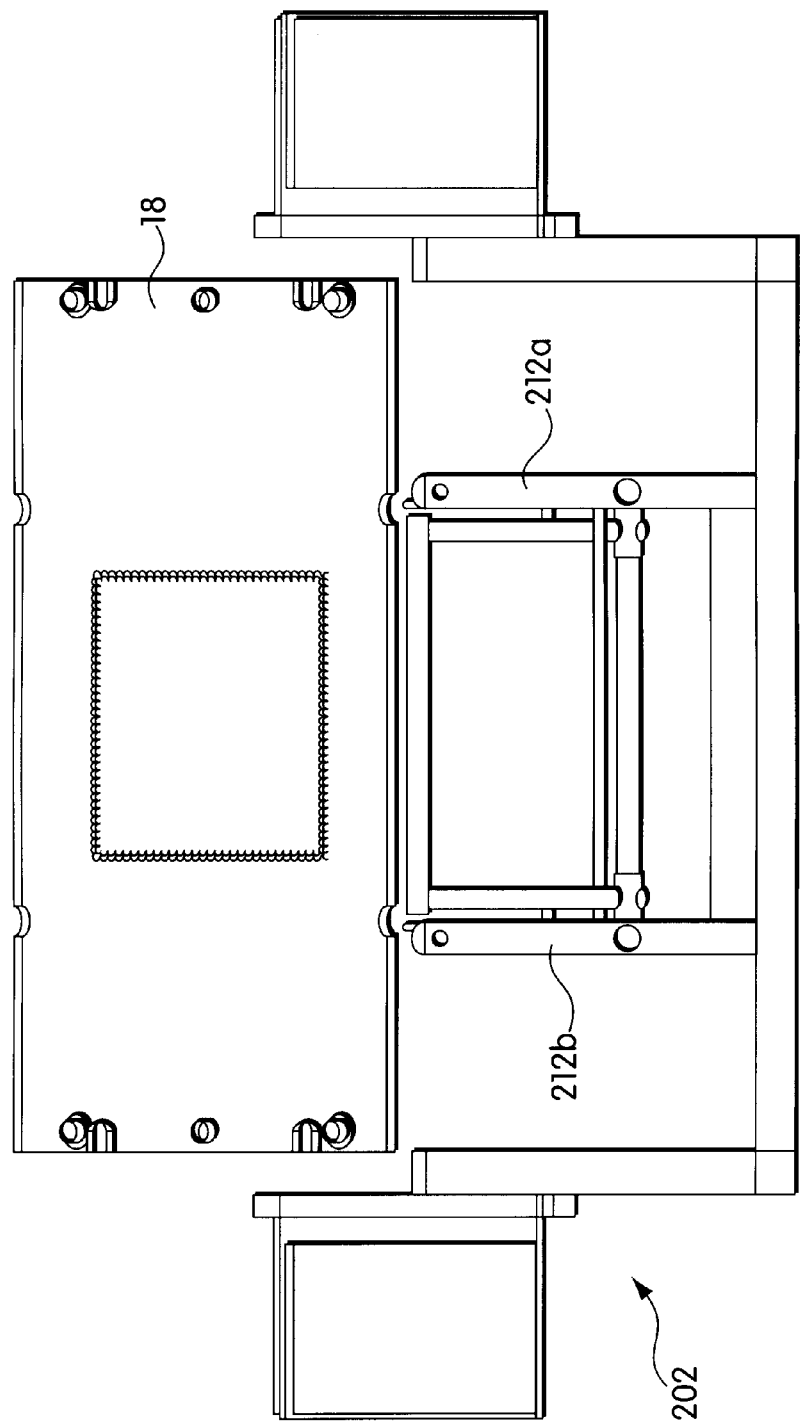
FIG. 34 is a top view of the solder ball retaining device of FIG. 31 in a third operational position.

A perspective view of the solder ball retaining device 202 is shown in FIG. 31, and a top view of the solder ball retaining device 202 and the carrier plate 18 is shown in FIGS. 32–34 with the solder ball retaining device in the predispense position, in a dispensing position, and in the post dispensing position. As described below in greater detail, in some embodiments of the present invention, the solder ball retaining device contains a sweeper 208 coupled to the back of the solder ball retaining device for wiping stray solder balls from the carrier plate.

Figure 35:
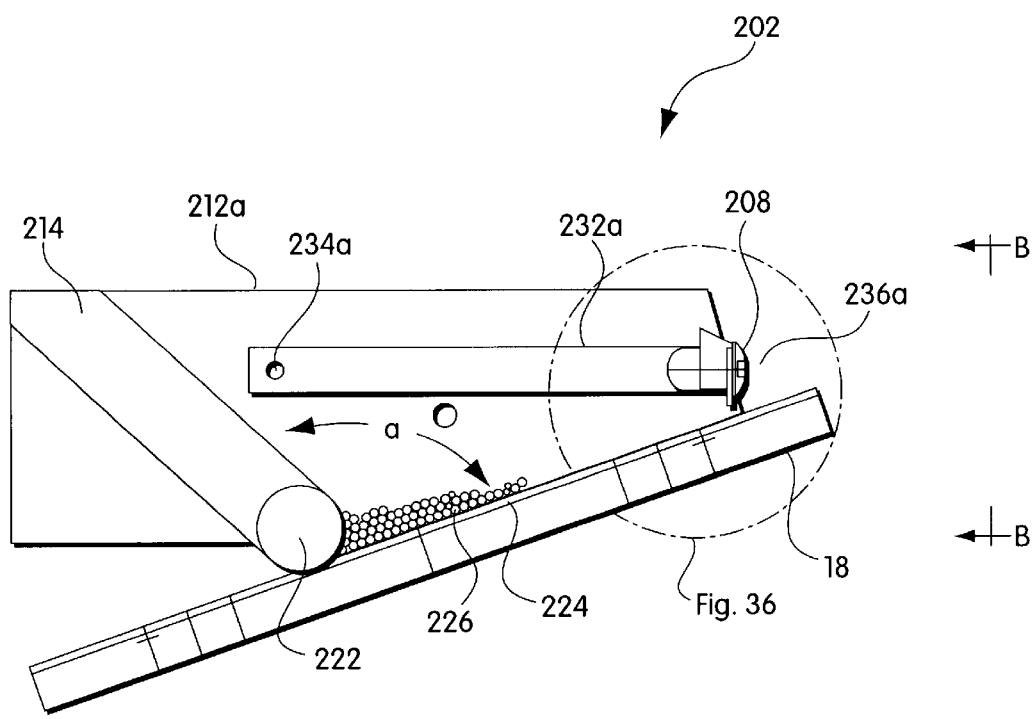
FIG. 35 is partial sectional side view of the solder ball retaining device of FIG. 31.

The solder ball retaining device 202 will now be described further with reference to FIGS. 28–37. The solder ball retaining device includes a bottomless bucket 210, a front bracket 218, two side brackets 216a and 216b and two mounting plates 220a and 220b. The mounting plates are used to couple the retaining device to belts of the drive mechanism. The bottomless bucket 210 is used to contain solder balls, and is formed by a pair of side walls 212a and 212b, a front plate 214, and a sweeper 208 that is part of a sweeper assembly 209. As shown in FIG. 35, a rod 222 is disposed on a bottom edge of the front plate. The rod is designed to be in contact with the top surface of the carrier plate when the solder ball retaining device is moved to control the velocity at which the solder balls 226 pass across the top surface of the carrier plate. In one embodiment, the rod 222 has a diameter of 0.250 inches and is made from stainless steel. The side walls 212a and 212b are designed to be disposed above the carrier plate such that a gap 226 exists between the bottom of the side walls and the carrier plate. In one embodiment the gap is approximately 0.005 inches. As shown in FIG. 35, the front plate 214 is disposed at an angle A with respect to the top surface of the corner plate. In one embodiment of the invention, the angle A is approximately 120°.

Figure 36:
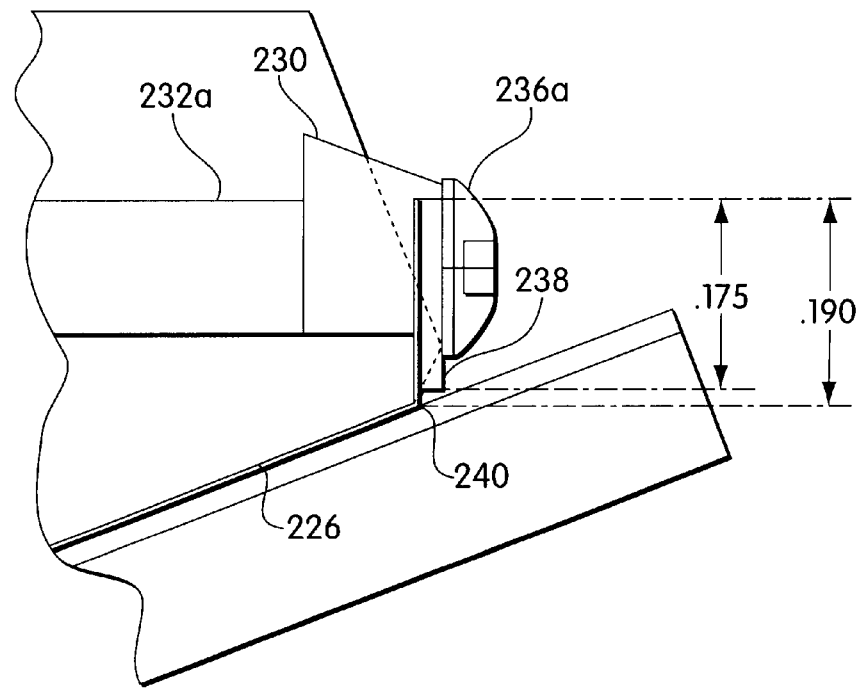
FIG. 36 is an expanded view of a detailed area of FIG. 35.
Figure 37:
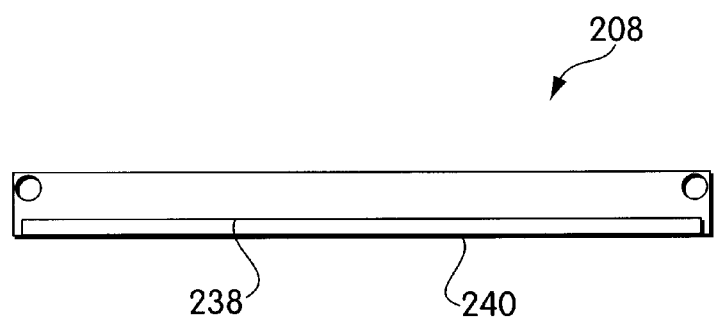
FIG. 37 is a view along line B—B of FIG. 35.

The sweeper assembly 209 is shown in detail in FIGS. 35–37. The sweeper assembly includes a front cross member support 228 and a back cross member support that connect two sweeper pivot arms 232a and 232b. Mounted to the back cross member support is the sweeper 208, The sweeper pivot arms 232a and 232b are respectively coupled to pivot points 234a and 234b on side walls 212a and 212b that enable the sweeper assembly to pivot about a rotational axis passing through the front cross member support 228. The rotational movement of the sweeper assembly allows the sweeper plate to remain in contact with the carrier plate when the solder ball retaining device is moved across the upper surface. The sweeper plate is coupled to the back cross member support using two button head screws 236a and 236b. In one embodiment, shown in FIGS. 36 and 37, the sweeper plate is implemented using two shims 238 and 240. Shim 238 is U-shaped and is thicker than shim 240, which is rectangular in shape. Shim 240 is designed to contact the top surface of the carrier plate to remove stray solder balls. Shim 238 does not contact the top surface of the carrier plate, but rather, is used to support shim 240 and to provide rigidity to shim 240. In one embodiment, shim 238 is made from polyvinyl chloride (PVC), shim 240 is made from polyethylene terephthalate (PET), shim 238 is 0.020 inches thick, and shim 240 is 0.004 inches thick.

Figure 29:
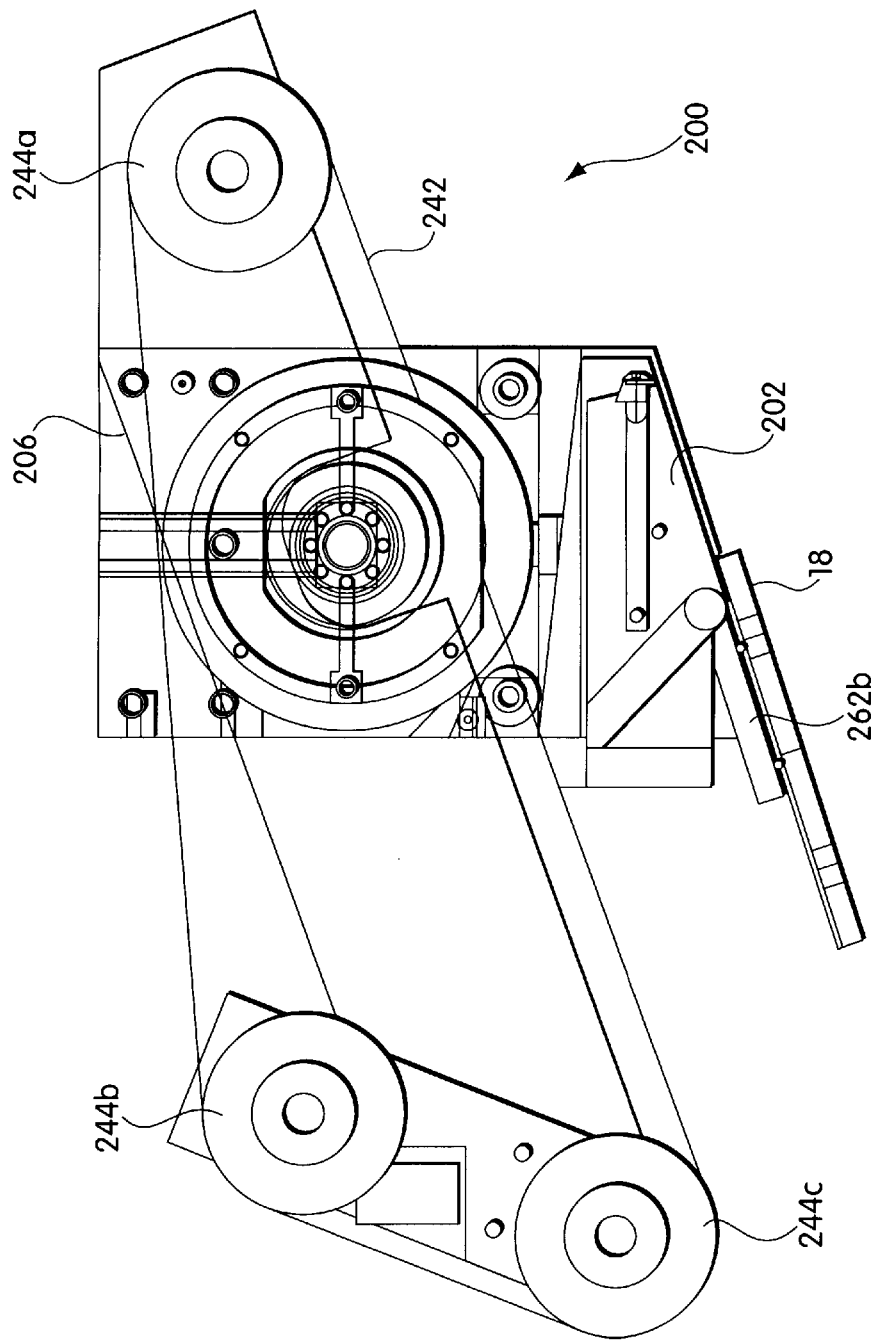
FIG. 29 is a partial side sectional view of the ball feed dispenser of FIG. 28 in a second operational position.
Figure 30:
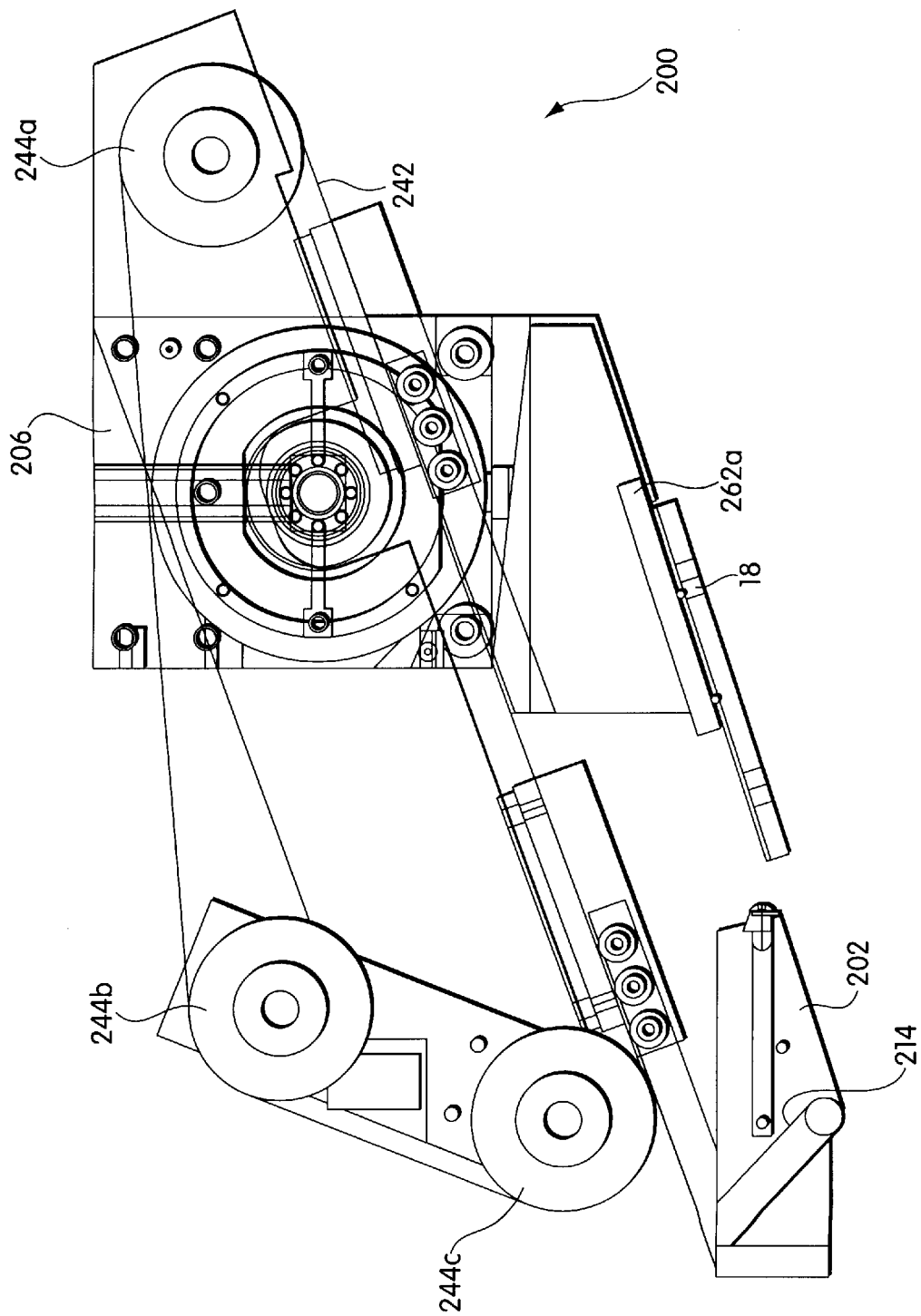
FIG. 30 is a partial side sectional view of the ball feed dispenser of FIG. 28 in a third operational position.

The drive mechanism includes a pair of belts supported by two sets of pulleys. One belt 242 and one set of pulleys 244a, 244b and 244c are shown in FIGS. 28–30. The other belt and set of pulleys are substantially the same as those shown in the figures. Pulley 244a has a sprocket 246 to couple to a drive shaft of a motor (not shown). In one embodiment, a servo motor, coupled to a motor control system, is used with the drive mechanism to provide smooth continuous movement of the solder ball retaining device. The solder ball retaining device is coupled to the pair of belts using the two mounting plates 220a and 220b.

Figure 38:
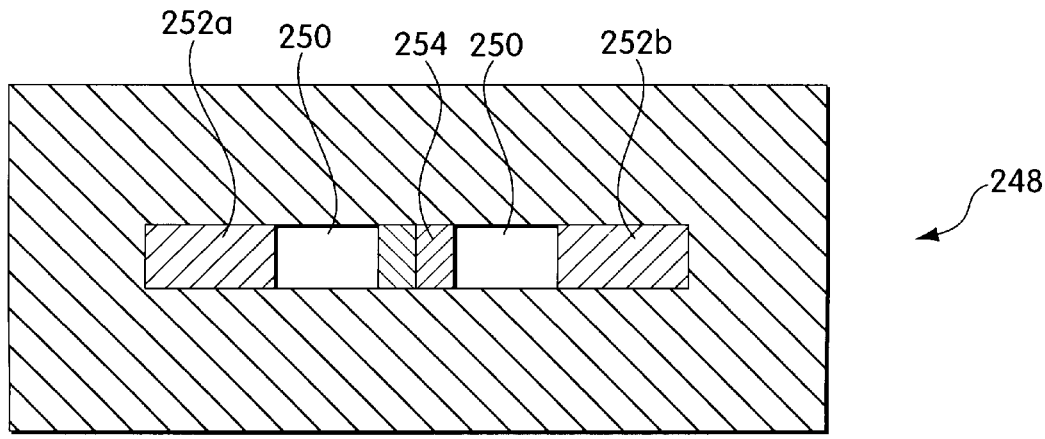
FIG. 38 is a top view of a disperser plate used in one embodiment of the present invention.
Figure 39:
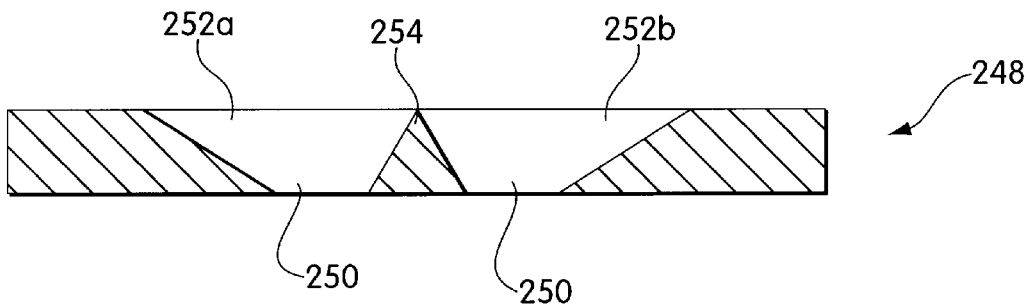
FIG. 39 is a cross-sectional view taken along line 39—39 of FIG. 38.

The solder ball feed device 206 in one embodiment of the present invention is similar to the ball feed 40 discussed above with reference to FIGS. 7 and 8, and operates in substantially the same manner. However, unlike the ball feed 40, the solder ball feed device 206 does not dispense solder balls directly onto the carrier plate 14, but rather, dispenses solder balls into the solder ball retaining device. In one embodiment, a dispersing device 248 is disposed on a lower housing of the solder ball feed device to cause the solder balls to evenly disperse across the solder ball retaining device. A top view of the dispersing device 248 is shown in FIG. 38, and a cross-sectional side view of the dispersing device is shown in FIG. 39. The dispersing device has a channel 250 through which the solder balls pass from the feed device to the retaining device. The dispersing device also has two sloped surfaces 252a and 252b and a triangular section 254. The sloped surfaces guide the solder balls to the channel section, while the triangular section causes the solder balls to disperse across the channel. The solder ball feed device in other embodiments can be implemented using other devices capable of depositing a predetermined quantity of solder balls into the retaining device.

Figure 41:
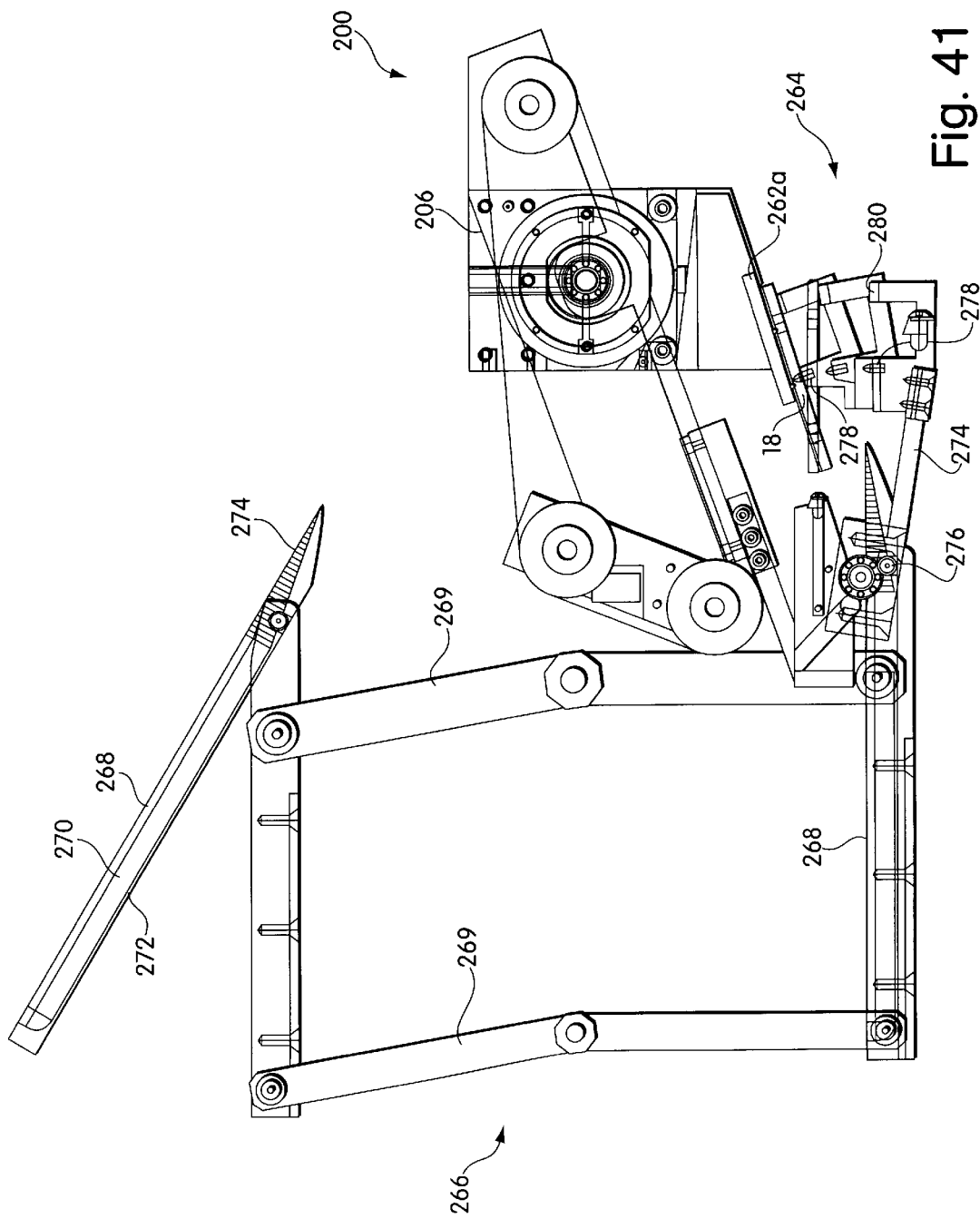
FIG. 41 is a partial side sectional view of a carrier plate tilt mechanism and a ball recycling apparatus coupled to the ball feed dispenser of FIG. 28.

Also disposed on the lower housing of the ball feed device is a lower plate 260 and a pair of angle arms 262a and 262b. Angle arm 262a is shown in FIG. 41, and angle arm 262b is shown in FIG. 29. The angle arms are coupled to the lower plate 260. The lower plate 260 provides a bottom surface for the bucket 210 when the solder ball retaining device is in the predispense position. The lower plate 260 enables the bucket to be filled prior to the carrier plate being fully in the tilted position to reduce the cycle time of a ball feed operation. The angle arms act as a tilt stop for the carrier plates to ensure that the carrier plates are disposed in the proper position in the ball feed apparatus. When the retaining device is in the predispense position, one angle arm is disposed on each side of the solder ball retaining device.

Figure 40:
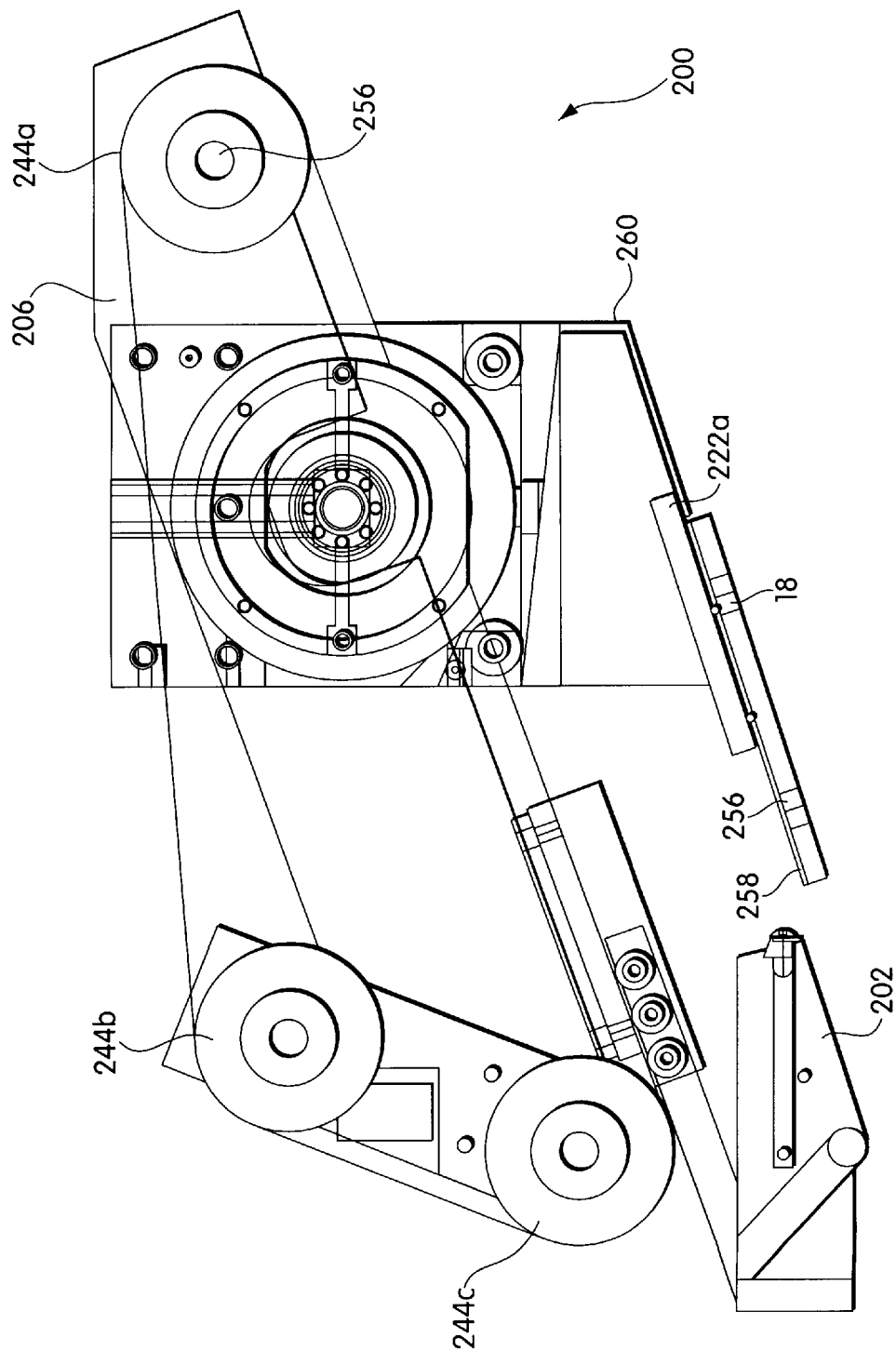
FIG. 40 is a partial side sectional view of the ball feed dispenser of FIG. 28 in a fourth operational position.

In one embodiment of the present invention, the drive mechanism 204 is designed to pivot about a rotational axis through the center of pulley 244a to lift the solder ball retaining device 202 to a raised position, as shown in FIG. 40. In the raised position, the retaining device is able to be moved back to the predispense position either before or as the carrier plate is moved from the solder ball dispenser to reduce the cycle time of dispensing. If the retaining device was not lifted, it could contact the carrier plate, and interfere with movement of the carrier plate from the solder ball dispenser. In one embodiment, discussed in greater detail below, the carrier plate is pivoted about a rotational axis through point 256 on the carrier plate (see, FIG. 40). For this embodiment, the front edge 258 of the carrier plate is lifted when the carrier plate is lowered to the horizontal position. If the retaining device was not lifted, it would strike the front corner 258 of the carrier plate when returning to the pre-dispense position.

A carrier plate tilt mechanism 264 and a ball recycling apparatus 266 used with embodiments of the present invention are shown with the ball feed apparatus 200 in FIG. 41. The ball recycling apparatus is used to capture unused balls from the solder ball retaining device for reuse by the ball feed apparatus. The ball recycling apparatus includes a tray 268 and a tray support 269. The tray 268 is movable along the tray support between a lowered fill position and a raised dump position. For illustration purposes, the tray is shown in both positions in FIG. 41. The tray includes a well 270 having a bottom surface 272, and also includes a lip 274 that is lowered to dump solder balls from the tray in the raised dump position. In the lowermost position, the tray is disposed beneath the retaining device, when the retaining device is in the post dispense position.

During movement of the retaining device during a ball feed operation, once the solder ball retaining device moves past the carrier plate, any remaining solder balls in the bucket of the retaining device will fall into the well of the tray. Once the retaining device has moved from the post dispense position back towards the pre-dispense position, the tray can be lifted to the raised dump position to dump unused solder balls back into the ball feed device. In one embodiment of the present invention, the ball feed device has a ball container with a funnel apparatus to facilitate receiving solder balls from the tray.

The tray can be moved from the lowermost position to the raised position either manually or automatically using a motor. The tray can be emptied after the filling of each carrier plate, or preferably, the well 270 is designed to have sufficient capacity such that the tray is emptied after several carrier plates have been filled.

The carrier plate tilt mechanism 264 includes a tilt arm 274 that rotates about a pivot point 276 under the control of a motor (not shown). In FIG. 41, the tilt arm is shown at three rotational positions to illustrate the movement of the tilt arm to tilt the carrier plate. Coupled to one end of the tilt arm are a contact plate and two contact pins that are used to lift the carrier plate. One contact pin 278 and the contact plate 280 are shown in FIG. 41. The other contact pin is substantially identical to that shown. In one embodiment of the invention, the carrier plates are fixed to the ball feed apparatus only at the front two recesses 88 (see, FIG. 2) to allow the carrier plate to rotate about pivot point 256 when contacted by the carrier tilt plate mechanism.

The carrier tilt plate mechanism operates as follows. Once a carrier plate is positioned in the ball feed apparatus, the tilt arm is rotated from the bottommost position shown in FIG. 41 to the uppermost position to lift the carrier plate. The contact plate 280 contact the rear of the carrier plate before the contact pins make contact with the carrier plate as shown in the middle rotational position of FIG. 41. The contact pins subsequently are inserted into holes 90 (see, FIG. 2) of the carrier plate to hold the carrier plate in proper position in the ball feed apparatus. The carrier plate is tilted until it contacts the angle arms 262a and 262b located on the lower housing of the ball feed device.

In one embodiment of the present invention, the solder ball feed device is implemented using a removable cassette. In this embodiment, when it is desired to change the size of the solder balls being dispensed, the ball feed cassette is replaced with a new cassette containing solder balls of the desired size. The use of a replaceable cassette reduces the possibility of mixing solder balls of different sizes and allows a change in the size of solder balls being used to occur quickly since the solder ball feed device does not have to be cleaned.

It has been found that the optimization of several parameters associated with the operation of the solder ball feed apparatus can greatly increase its performance. These parameters include: velocity of the ball retaining device across the carrier plate, size and shape of the holes in the carrier plate, and the tilt angle of the carrier plate. In general, for one embodiment, it has been found that: an optimum range for the tilt angle for the carrier plate is 18° to 25°, and an optimum range for velocity of the ball retaining device is 1 to 5 inches per second. It has also been found that the quantity of solder balls dispensed onto the carrier plate should be on the order of at least 3 to 5 times the number of holes to be filled in the carrier plate.

In one embodiment of the present invention, for solder balls having a diameter of 0.030 inches, carrier plates having a hole size of 0.036 inches, a retaining device velocity of approximately 1 inch per second, and a tilt angle of approximately 21°, it has been found that the holes in the carrier plate can be filled with one pass of the solder ball retaining device. It has been found that in this embodiment, the performance is approximately the same with or without the sweeper.

In another embodiment, for solder balls having a diameter of 0.030 inches, and a tilt angle of 21°, by increasing the diameter of the holes to 0.038 inches, the velocity can be increased to 4.3 inches per second. For this embodiment, it is desirable to use the sweeper to prevent stray balls from becoming partially trapped in the larger holes. In place of larger holes, holes of 0.036 inches with a chamfered top may be used. In one embodiment, the chamfer enlarges the top of the hole to 0.038 inches, and a chamfer angle of 45° is used. For embodiments using carrier plates with larger holes or chamfered tops, it is desirable to use the sweeper to prevent stray balls from becoming partially trapped in the holes.

In another embodiment, used for solder balls having a diameter of 0.012 inches, the hole size is 0.016 inches, the retaining device velocity is approximately 1 inch per second, and the tilt angle is between 21° and 24°. In this embodiment, it is desirable to use the sweeper. Using this embodiment, the inventors have successfully filled 10,201 holes in a carrier plate arranged in a 101×101 array.

In embodiments of the present invention discussed above, solder ball dispensers have been described as being used with carrier plates which are used to contain solder balls for placement on semiconductor devices. As understood by one skilled in the art, solder ball dispensers in accordance with embodiments of the present invention can be used to directly place solder balls on semiconductor devices having stencils, masks or some similar apparatus for aligning the solder balls on the semiconductor devices. In addition, a flexible substrate may be used in place of the carrier plate in embodiments of the present invention.

Embodiments of the present invention directed to solder ball dispensers discussed above are not limited for use with embodiments of the solder ball displacement apparatus 10. As understood by one skilled in the art, the solder ball dispensers may be used on other solder ball displacement apparatuses as well.

Equivalents

While this invention has been particularly shown and described with references to preferred embodiments thereof, it will be understood by those skilled in the art that various changes in form and details may be made therein without departing from the spirit and scope of the invention as defined by the appended claims.

For example, other preferred embodiments of apparatus 10, can have less than five ball feed stations. In such a case, the omitted ball feed stations can be replaced with additional pattern head stations such that different patterns of solder balls 102 can be placed upon different semiconductor substrate parts without making any mechanical changes. The support fingers 16a/16b can also be fixed and spaced apart from each other by an opening large enough for ball placement head 126 to move downwardly therethrough. In this arrangement, only five carrier plates 18 are employed. Also, although the stations in apparatus 10 have been shown to be arranged in a circle, the stations can be arranged in a straight line. In such a case, a linear actuator would move carrier plate 18. In addition, although apparatus 10 has been described for depositing solder balls 102 onto individual parts 72, apparatus 10 can also be used for depositing solder balls 102 onto strips or panels. Other containers for holding parts 72 can be employed such as the Auer™ Boat. Finally, solder balls having dimensions differing than those described above can be deposited upon parts 72. In such a case, the dimensions of the components of apparatus 10 should be altered accordingly.

What is claimed is:

1. A solder ball dispenser for dispensing solder balls to a plate having an upper surface with an array of holes formed therein, the solder ball dispenser comprising:

a plate support constructed and arranged to support the plate such that the upper surface is tilted at an angle from horizontal;

a ball feed device, disposed above the plate support to provide solder balls to the plate; and a solder ball retainer positioned above the plate support, the solder ball retainer being movable across the upper surface of the plate for controlling a speed at which the solder balls move across the plate.

2. The solder ball dispenser of claim 1 further comprising a ball sweeper to sweep stray solder balls from the plate.

3. The solder ball dispenser of claim 2 in which the solder ball retainer is a bottomless enclosure that contains the solder balls as the solder balls move across the plate.

4. The solder ball dispenser of claim 3 in which the solder ball retainer has a sloped leading wall.

5. The solder ball dispenser of claim 4 in which the solder ball retainer has a rear portion at which the ball sweeper is located.

6. The solder ball dispenser of claim 1 further comprising a spreading device positioned between the ball feed and the carrier plate that spreads the solder balls over the plate.

7. The solder ball dispenser of claim 6 in which the spreading device includes an angled surface that disperses the solder balls.

8. The solder ball dispenser of claim 1 wherein the plate support is constructed and arranged such that the angle from horizontal is between 18° and 25°.

9. The solder ball dispenser of claim 8 wherein the plate support is constructed and arranged such that the angle from horizontal is approximately 21°+1°.

10. The solder ball dispenser of claim 3 further comprising a temporary retainer bottom, and wherein the solder ball retainer is capable of being positioned over the temporary retainer bottom to allow the solder ball retainer to be filled with solder balls prior to moving the plate into position on the plate support.

11. The solder ball dispenser of claim 1 further comprising a recirculating tray that catches unused solder balls and dumps said unused solder balls back into the ball feed.

12. The solder ball dispenser of claim 1 wherein the solder ball feed includes a removable cassette style cartridge.

13. The solder ball dispenser of claim 2 in combination with the plate, and wherein the holes in the plate have a diameter that is more than 20% greater than a diameter of solder balls being dispensed.

14. The solder ball dispenser of claim 2 in combination with the plate, and wherein the holes in the plate have a chamfered top portion.

15. A solder ball dispenser for dispensing solder balls to a plate having an upper surface with an array of holes formed therein, the solder ball dispenser comprising:

a ball feed that provides solder balls to the plate;

a solder ball retainer positioned above the plate, the solder ball retainer being constructed and arranged to contain the solder balls over the array of holes, the solder ball retainer being movable across the upper surface of the plate; and a ball sweeper that sweeps stray solder balls from the carrier plate.

16. A solder ball dispensing system comprising:

a plate having an upper surface with an array of holes formed therein to receive solder balls;

a plate support constructed and arranged to support the plate such that the upper surface is tilted from horizontal;

a ball feed disposed above the plate that provides solder balls to the plate; and a solder ball retainer positioned above the plate, the solder ball retainer being moveable across the upper surface of the plate to control a speed at which the solder balls move across the plate, the holes within the plate having chamfered upper portions.

17. The solder ball dispensing system of claim 16, further comprising:

a recirculating tray disposed in the dispensing system to collect unused solder balls dispensed onto the plate; and a drive mechanism coupled to the tray that lifts the tray upwardly and dumps the unused solder balls into the solder ball dispensing system.

18. The solder ball dispensing system of claim 17, wherein the drive is constructed and arranged to move the tray in an arc.

19. A solder ball dispenser for dispensing solder balls on a substrate having an upper surface with an array of holes formed therein, the solder ball dispenser comprising:

a substrate support constructed and arranged to support the substrate such that the upper surface is tilted at an angle from horizontal;

a ball feed device, disposed above the substrate support to provide solder balls to the substrate; and a solder ball retainer positioned above the substrate support, the solder ball retainer being movable across the upper surface of the substrate for controlling a speed at which the solder balls move across the substrate.

20. A solder ball dispenser for dispensing solder balls to a plate having an upper surface with an array of holes formed therein, the solder ball dispenser comprising:

a plate support constructed and arranged to support the plate such that the upper surface is tilted at an angle from horizontal;

a ball feed device, disposed above the plate support to provide solder balls to the plate; and means for controlling a speed at which solder balls move across the upper surface of the plate to place a solder ball in each hole of the array of holes.

* * * * *